(12) United States Patent
Samuelson et al.

(10) Patent No.: US 8,183,587 B2
(45) Date of Patent: May 22, 2012

(54) LED WITH UPSTANDING NANOWIRE STRUCTURE AND METHOD OF PRODUCING SUCH

(75) Inventors: Lars Ivar Samuelson, Malmö (SE); Bo Pedersen, Kastrup (DK); Bjorn Jonas Ohlsson, Malmö (SE)

(73) Assignee: QuNano AB, Lund (SE)

( * ) Notice: Subject to any disclaimer, the term of this patent is extended or adjusted under 35 U.S.C. 154(b) by 636 days.

(21) Appl. No.: 11/812,225

(22) Filed: Jun. 15, 2007

(65) Prior Publication Data
US 2008/0149944 A1    Jun. 26, 2008

(30) Foreign Application Priority Data
Dec. 22, 2006  (SE) .................................... 0602841

(51) Int. Cl.
*H01L 33/00* (2010.01)
(52) U.S. Cl. ..................... 257/98; 257/79; 257/E33.005
(58) Field of Classification Search ................... 257/98, 257/E33.005
See application file for complete search history.

(56) References Cited

U.S. PATENT DOCUMENTS

| | | | |
|---|---|---|---|
| 5,196,396 A | 3/1993 | Lieber | |
| 5,252,835 A | 10/1993 | Lieber et al. | |
| 5,332,910 A | 7/1994 | Haraguchi et al. | |
| 5,362,972 A | 11/1994 | Yazawa et al. | |
| 5,381,753 A | 1/1995 | Okajima et al. | |
| 5,544,617 A | 8/1996 | Terui et al. | |
| 5,840,435 A | 11/1998 | Lieber et al. | |
| 5,858,862 A | 1/1999 | Westwater et al. | |
| 5,897,945 A | 4/1999 | Lieber et al. | |
| 5,899,734 A | 5/1999 | Lee | |
| 5,976,957 A | 11/1999 | Westwater et al. | |
| 5,997,832 A | 12/1999 | Lieber et al. | |
| 6,130,142 A | 10/2000 | Westwater et al. | |
| 6,130,143 A | 10/2000 | Westwater et al. | |
| 6,159,742 A | 12/2000 | Lieber et al. | |
| 6,190,634 B1 | 2/2001 | Lieber et al. | |
| 6,307,241 B1 | 10/2001 | Awschalom et al. | |
| 6,340,822 B1 | 1/2002 | Brown et al. | |

(Continued)

FOREIGN PATENT DOCUMENTS
EP          0 443 920         8/1991
(Continued)

OTHER PUBLICATIONS

Bindal et al., "The impact of silicon nano-wire technology on the design of single-work-function CMOS transistors and circuits," Nanotechnology, 2006, 17:4340-4351.

(Continued)

*Primary Examiner* — Lynne Gurley
*Assistant Examiner* — Hsin-Yi Hsieh
(74) *Attorney, Agent, or Firm* — The Marbury Law Group, PLLC

(57) ABSTRACT

The present invention relates to light emitting diodes, LEDs. In particular the invention relates to a LED comprising a nanowire as an active component. The nanostructured LED according to the embodiments of the invention comprises a substrate and at an upstanding nanowire protruding from the substrate. A pn-junction giving an active region to produce light is present within the structure. The nanowire, or at least a part of the nanowire, forms a wave-guiding section directing at least a portion of the light produced in the active region in a direction given by the nanowire.

28 Claims, 7 Drawing Sheets

U.S. PATENT DOCUMENTS

| | | |
|---|---|---|
| 6,455,340 B1 | 9/2002 | Chua et al. |
| 6,559,468 B1 | 5/2003 | Kuekes et al. |
| 6,586,965 B2 | 7/2003 | Kuekes |
| 6,596,377 B1 | 7/2003 | Hersee et al. |
| 6,693,021 B1 | 2/2004 | Motoki et al. |
| 6,709,929 B2 | 3/2004 | Zhang et al. |
| 6,716,409 B2 | 4/2004 | Hafner et al. |
| 6,743,408 B2 | 6/2004 | Lieber et al. |
| 7,303,631 B2 | 12/2007 | Conley, Jr. et al. |
| 7,309,621 B2 | 12/2007 | Conley, Jr. et al. |
| 7,335,908 B2 | 2/2008 | Samuelson et al. |
| 7,354,850 B2 | 4/2008 | Seifert et al. |
| 7,445,742 B2 | 11/2008 | Chen et al. |
| 2002/0129761 A1 | 9/2002 | Takami |
| 2002/0130311 A1 | 9/2002 | Lieber et al. |
| 2002/0172820 A1 | 11/2002 | Majumdar et al. |
| 2002/0175408 A1 | 11/2002 | Majumdar et al. |
| 2003/0089899 A1 | 5/2003 | Lieber et al. |
| 2003/0102444 A1 | 6/2003 | Deppert et al. |
| 2003/0121764 A1 | 7/2003 | Yang et al. |
| 2003/0200521 A1 | 10/2003 | DeHon et al. |
| 2004/0175844 A1 | 9/2004 | Yang et al. |
| 2004/0213307 A1 | 10/2004 | Lieber et al. |
| 2004/0252737 A1 | 12/2004 | Yi et al. |
| 2004/0262636 A1 | 12/2004 | Yang et al. |
| 2005/0006673 A1 | 1/2005 | Samuelson et al. |
| 2005/0011431 A1 | 1/2005 | Samuelson et al. |
| 2005/0017171 A1 | 1/2005 | Samuelson et al. |
| 2005/0161662 A1 | 7/2005 | Majumdar et al. |
| 2005/0199886 A1 | 9/2005 | Yi et al. |
| 2006/0019470 A1 | 1/2006 | Seifert et al. |
| 2006/0057360 A1 | 3/2006 | Samuelson et al. |
| 2006/0073680 A1 | 4/2006 | Han et al. |
| 2006/0112466 A1 | 5/2006 | Den |
| 2006/0125056 A1 | 6/2006 | Samuelson et al. |
| 2006/0189018 A1 | 8/2006 | Yi et al. |
| 2006/0223211 A1 | 10/2006 | Mishra et al. |
| 2007/0001220 A1 | 1/2007 | Tombler, Jr. et al. |
| 2007/0172183 A1 | 7/2007 | Wang |
| 2007/0206488 A1 | 9/2007 | Thelander et al. |
| 2007/0257264 A1 | 11/2007 | Hersee et al. |
| 2007/0286945 A1 | 12/2007 | Lahnor et al. |
| 2008/0036038 A1 | 2/2008 | Hersee et al. |
| 2008/0149946 A1 | 6/2008 | Kim et al. |
| 2010/0025673 A1* | 2/2010 | Hu et al. .................. 257/43 |

FOREIGN PATENT DOCUMENTS

| | | |
|---|---|---|
| EP | 0 544 408 A2 | 6/1993 |
| EP | 0 838 865 | 4/1998 |
| EP | 0 544 408 B1 | 1/2000 |
| EP | 1 221 722 A1 | 7/2002 |
| EP | 1 314 189 | 5/2003 |
| EP | 1 342 075 | 9/2003 |
| JP | 2000-068493 | 3/2000 |
| WO | WO 95/02709 | 1/1995 |
| WO | WO 97/31139 | 8/1997 |
| WO | WO 01/03208 | 1/2001 |
| WO | WO 01/77726 | 10/2001 |
| WO | WO 01/84238 | 11/2001 |
| WO | WO 02/01648 | 1/2002 |
| WO | WO 02/17362 A2 | 2/2002 |
| WO | WO 02/48701 A2 | 6/2002 |
| WO | WO 02/080280 | 10/2002 |
| WO | WO 02/095883 A2 | 11/2002 |
| WO | WO 03/005450 | 1/2003 |
| WO | WO 03/053851 | 7/2003 |
| WO | WO 03/063208 | 7/2003 |
| WO | WO 2004/010552 | 1/2004 |
| WO | WO 2004/038767 | 5/2004 |
| WO | WO 2006/135336 A1 | 12/2006 |

OTHER PUBLICATIONS

Bryllert et al., "Vertical wrap-gated nanowire transistors," Nanotechnology, 2006, 17:S227-S230.

U.S. Appl. No. 12/520,125, filed Dec. 20, 2007, Pedersen et al.

U.S. Appl. No. 12/224,822, filed Mar. 7, 2007, Samuelson et al.

International Search Report and Written Opinion dated Apr. 25, 2008, in PCT/SE2008/050036, 12 pages.

Bertness et al., "Catalyst-Free Growth of GaN Nanowires," Journal of Electronic Materials, 2006, 35(4):576-580.

Dailey et al., "Vapor-liquid-solid growth of germanium nanostructures on silicon," Journal of Applied Physics, Dec. 15, 2004, 96(12):7556-7567.

Hersee et al., "The Controlled Growth of GaN Nanowires," Nano Letters, 2006, 6(8)1808-1811.

Kipshidze et al., "Controlled growth of GaN nanowires by pulsed metalorganic chemical vapor deposition," Applied Physics Letters, 2005, 86:033104-1 to 033104-3.

Ma et al., "Small-Diameter Silicon Nanowire Surfaces," Science, Mar. 21, 2003, 299:1874-1877.

Mohan et al., "Controlled growth of highly uniform, axial/radial direction-defined, individually addressable InP nanowire arrays," Nanotechnology, 2005, 16:2903-2907.

Mohan et al., "Realization of conductive InAs nanotubes based on lattice-mismatched InP/InAs core-shell nanowires," Applied Physics Letters, 2006, 88:013110-1 to 013110-3.

Pan et al., "Single-crystal growth of metallic nanowires with preferred orientation," Nanotechnology, 2005, 16:1559-1564.

Qian et al., "Core/Multishell Nanowire Heterostructures as Multicolor, High-Efficiency Light-Emitting Diodes," Nano Letters, 2005, 5(11):2287-2291.

U.S. Appl. No. 10/613,071, filed Jul. 7, 2003, Samuelson et al.

U.S. Appl. No. 11/812,226, filed Jun. 15, 2007, Samuelson et al.

Yazawa, M. et al, "Heteroepitaxial Ultrafine Wire-Like Growth of InAs on GaAs Substrates", *Applied Physics Letters*, Mar. 11, 1991, pp. 1080-1082, vol. 58, No. 10.

Haraguchi, K. et al., "GaAs p-n junction formed in quantum wire crystals", *Applied Physics Letters*, Feb. 10, 1992, pp. 745-747, vol. 60, No. 6.

Yazawa, M., et al., "Effect of one monolayer of surface gold atoms on the epitaxial growth of InAs nanowhiskers", *Applied Physics Letters*, Oct. 26, 1992, pp. 2051-2053, vol. 61.

Yazawa, M., "Nanocolumns composed of GaAs-InAs jointed whiskers and Si02 covers",*Applied Physics Letters*, Aug. 29, 1994, pp. 1157-1158, vol. 65.

Sato, T., "Site-controlled growth of nanowhiskers", *Applied Physics Letters*, Jan. 9, 1995, pp. 159-161, vol. 66.

Hiruma, K., et al., "Growth and optical properties of nanometerscale GaAs and InAs whiskers", *Applied Physics Review*, Jan. 15, 1995, pp. 447-462, vol. 77.

Hiruma, K., et al., "Growth and Characterization of Nanometer-Scale GaAs, AiGaAs and GaAs/InAs Wires", *IEICE Trans. Electron.*, Sep. 1, 1994, pp. 1420-1425, vol. E77-C, No. 9.

Hiruma, K., et al., "Gas free-standing quantum-size wires", *Journal of Applied Physics*, Sep. 1, 1993, pp. 3162-3171, vol. 74.

Haraguchi, K., et al., "Polarization dependence of light emitted from GaAs p-n junctions in quantum wire crystals", *Journal of Applied Physics*, Apr. 15, 1994, pp. 4220-4225, vol. 75.

Hiruma, K., et al., Self-organized growth of GaAs/InAs heterostructure nanocylinders by organometallic vapor phase epitaxy, *Journal of Crystal Growth*, Jan. 1, 1996, pp. 226-231, vol. 163.

Lieber, C., "Nanowires as Building Blocks for Nanoscale Science and Technology", *Abstracts of Papers of the Amer. Chem Soc.*, Aug. 18, 2002, pp. 033-Camp Part 1, vol. 224.

Duan, X. et al., "Laser Assisted Catalytic Growth of Single-Crystal Compound Semiconductor Nanowires", *Abstracts of Papers of—the Amer. Chem. Soc.*, Mar. 26, 2000, pp. 676-Inor Part 1, vol. 219.

Duan, X. et al., "Laser Assisted Catalytic Growth of Semiconductor Nanowires for Nanoscale Electronic Optoelectronic Device Application", *Abstracts of Papers of—the Amer. Chem. Soc.*, Apr. 1, 2001, pp. 644-Inor Part 1, vol. 221.

Lieber, C., "Semiconductor Nanowires: Building Blocks for Nanoscale Science and Technology", *Abstracts of Papers of—the Amer. Chem. Soc.*, Aug. 1, 2001, pp. 383-Phys Part 2, vol. 222.

Huang, Y., et al., "Integrated Optoelectronics Assembled from Semiconductor Nanowires", *Abstracts of Papers of—the Amer. Chem. Soc.*, Aug. 18, 2002, pp. 039-Phys Part 2, vol. 224.

Hu, J. et al., "Chemistry and Physics in One Dimension: Synthesis and Properties of Nanowires and Nanotubes", *Acc. Chem. Res.*, Feb. 20, 1999, pp. 435-445, vol. 32, No. 5.

Duan, X. et al., "General Synthesis of Compound Semiconductor Nanowires", *Advanced Materials*, Jan. 1, 2000, pp. 298-302, vol. 12, No. 4.

Duan, X., et al., "Synthesis and optical properties of gallium arsenide nanowires", *Applied Physics Letters*, Feb. 28, 2000, pp. 1116-1118, vol. 76, No. 9.

Cui, Y., et al., "Diameter-controlled synthesis of single-crystal silicon nanowires", *Applied Physics Letters*, Apr. 9, 2001, pp. 2214-2216, vol. 78, No. 15.

Gudiksen, M.S., et al., "Diameter-selective synthesis of semiconductor nanowires", *J. Am. Chem. Soc.*, Aug. 22, 2000, pp. 8801-8802, vol. 122.

Gudiksen, M.S., et al., "Size-Dependent Photoluminescence from Single Indium Phosphide Nanowires", *Journal of Physical Chemistry B*, Mar. 30, 2002, pp. 4036-4039, vol. 106, No. 16.

Duan, X., et al., "Laser-Assister Catalytic Growth of Single Crystal GaN Nanowires", *Journal of Amer. Chem. Soc.*, Dec. 18, 1999, pp. 188-189, vol. 122, No. 1.

Huang, Y., et al., "Gallium Nitride Nanowire Nanodevices", *Nano Letters*, Jan. 11, 2002, pp. 81-82, vol. 2, No. 2.

Lieber, C., "Nanowire Sugerlattices", *Nano Letters*, Jan. 25, 2002, pp. 82-82, vol. 2, No. 2.

Duan, X., et al., "Nonvolatile Memory and Programmable Logic from Molecule-Gated Nanowires", *Nano Letters*, May 1, 2002, pp. 487-490, vol. 2, No. 5.

Cui, Y., et al., "High Performance Silicon Nanowire Field Effect Transistors", *Nano Letters*, Jan. 1, 2003, pp. 149-152, vol. 3, No. 2.

Zhong, Z., et al., "Synthesis of P-Type Gallium Nitride Nanowires for Electronic and Photonic Nanodevices", *Nano Letters*, Feb. 20, 2003, pp. 343-346, vol. 3, No. 3.

Hu, J., et al., "Controlled Growth and Electrical Properties of Heterojunctions of Carbon Nanotubes and Silicon Nanowires", *Nature*, May 6, 1999, pp. 48-51, vol. 399.

Duan, X., et al., "Indium phosphide nanowires as building blocks for nanoscale electronic and optoelectronic devices", *Nature*, Jan. 4, 2001, pp. 66-69, vol. 409.

Gudiksen, M.S., et al., "Growth of nanawire superlattice structures for nanoscale photonics and electronics", *Nature*, Feb. 7, 2002, , pp. 617-620, vol. 415.

Lauhon, L., et al., "Epitaxial Core-Shell and Core-Multishell Nanowire Heterostructure", *Nature*, Nov. 7, 2002, pp. 57-61, vol. 420, No. 6911.

Duan, X., "Single-nanowire electrically driven lasers", *Nature*, Jan. 16, 2003, pp. 241-244, vol. 421.

Lieber, C., "The incredible shrinking circuit", *Sci. Am.*, Sep. 1, 2001, pp. 58-64, vol. 285.

Morales, A., et al., "A Laser Ablation Method for the Synthesis of Crystalline Semiconductor Nanowires", *Science*, Jan. 9, 1998, pp. 208-211, vol. 279.

Cui, Y., et al., "Functional Nanoscale Electronic Devices Assembled Using Silicon Nanowire Building Blocks", *Science*, Feb. 2, 2001, pp. 851-853, vol. 291.

Wang, J., et al., "Highly Polarized Photoluminesence and Photodetection from Single Indium Phosphide Nanowires", *Science*, Aug. 24, 2001, pp. 1455-1457, vol. 293, No. 5534.

Cui, Y., et al., "Nanowire nanosensors for highly sensitive and selective detection of biological and chemical species", *Science*, Aug. 17, 2001, pp. 1289-1292, vol. 293.

Huang, Y., et al., "Logic Gates and Computation from Assembled Nanowire Building Blocks", *Science*, Nov. 9, 2001, pp. 1313-1317, vol. 294.

Cui, Y., et al., "Doping and Electrical Transport in Silicon Nanowires", *The Journal of Physical Chemistry B*, May 11, 2000, pp. 5213-5216, vol. 104, No. 22.

Gudiksen, M.S., et al., "Synthetic Control of the Diameter and Length of Single Crystal Semiconductor Nanowires", *The Journal of Physical Chemistry B*, Apr. 18, 2001, pp. 4062-4064, vol. 105.

Morales, A., et al., "Rational Synthesis of Silicon Nanowires", *INOR*, 651, Jan. 1, 2001.

Wong, E., et al., "Nanobeam Mechanics: Elasticity, Strength, and Toughness of Nanorods and Nanotubes", *Science*, Sep. 26, 1997, pp. 1971-1975, vol. 277.

Dai, H., et al., "Synthesis and Characterization of Carbide Nanorods", *Nature*, Jun. 29, 1995, pp. 769-772, vol. 375.

Junno, T., et al., "Controlled manipulation of nanogarticles with an atomic force microscope", *Applied Physics Letters*, Jun. 26, 1995, pp. 3627-3629, vol. 66.

Zwiller, V., et al., "Single quantum dots emit single photons at a time: Antibunching experiment", *Applied Physics Letters*, Apr. 23, 2001, pp. 2476-2478, vol. 78, No. 17.

Borgstrom, M., et al., "High peak-to-valley ratios observed in InAs/InP resonant tunneling quantum dot stacks", *Applied Physics Letters*, May 21, 2001, pp. 3232-3234, vol. 78, No. 21.

Thelander, et al., "Gold manoparticle single-electron transistor with carbon nanotube leads", *Applied Physics Letters*, Sep. 24, 2001, pp. 2106-2108, vol. 79, No. 13.

Ohlsson, B.J., et al., "Size-, shape-, and position-controlled GaAs nono-whiskers", *Applied Physics Letters*, Nov. 12, 2001, pp. 3335-3337, vol. 79, No. 20.

Bjork, M.T., et al., :One-dimensional heterostructures in semiconductor nanowhiskers, *Applied Physics Letters*, Feb. 11, 2002, pp. 1058-1060, vol. 80, No. 6.

Persson, M.P. et al., "Electronis Structure of Nanometer-Scale GaAs Whiskers", *Applied Physics Letters*, Aug. 12, 2002, pp. 1309-1311, vol. 81, No. 7.

Thelander, C., et al., "Single-Electron Transistors in Heterostructure Nanowires", *Applied Physics Letters* , Sep. 8, 2003, pp. 2052-2054, vol. 83, No. 10.

Panev, N., et al., "Sharp Exciton Emission From Single InAs Quantum Dots in GaAs Nanowires", *Applied Physics Letters* , Sep. 15, 2003, pp. 2238-2240, vol. 83, No. 11.

Bjork, M.T., "Nanowire resonant tunelling diodes", *Applied Physics Letters*, Dec. 2, 2002, pp. 4458-4460, vol. 81, No. 23.

Persson, A., "Oriented Growth of InAs-based Nanowhiskers", *Diploma Work, Lund Institute of Technology, Lund University*, May 29, 2001, pp. 1-48.

Ohlsson, J., "Semiconductor Hetero- and Nanostructures", *Doctoral Thesis, Lund Institute of Technology, Lund University*, Nov. 23, 2001, Thelander, C., "Quantum Devices from the Assembly of Zero-and One-Dimensional Building Blocks", *Doctoral Thesis, Lund University*, Nov. 7, 2003.

Ohlsson, B., et al., "Anisotropic GaAs island phase grown on flat Gap: A stranski-Krastanow-formed corrugated surface", *Journal of Applied Physics*, May 15, 2001, pp. 5726-5730, vol. 89, No. 10.

Magnusson, M., et al., "Gold nanogarticles: Production, reshaping, and thermal charging", *Journal of Nanoparticle Research*, Jan. 1, 1999, pp. 243-251, vol. 1.

Samuelson, L., "Self-Forming Nanoscale Devices", *Materials Today*, Oct. 22, 2003, pp. 22-31.

Ohlsson, B., et al., "Fabrication and characterization of III-V nanowhiskers", *MSS10 Conference—Austria*, Jul. 23-27, 2001.

Bjork, M.T., et al., "One-dimensional Steeplechase for Electrons Realized", *Nano Letters*, Jan. 19, 2002, pp. 87-89, vol. 2, No. 2.

Martensson, T., et al., "Fabrication of Individually Seeded Nanowire Arrays by Vapour-Liquid-Solid Growth", *Nanotechnology*, Oct. 17, 2003, pp. 1255-1258, No. 14.

Burgess, D.S., "Nanowire Heterostructures Form Tunneling Diodes", *Photonics Spectra*, pp. 3-5, vol. 37, No. 2.

Pettersson, H., et al., "Electrical and Optical Properties of Self-Assembled InAs Quantum Dots in InP Studied by Space-Charge Spectroscopy and Photoluminescence", *Phys. Rev. B*, Feb. 15, 2000, pp. 4795-4800, vol. 61, No. 7.

Ohlsson, B.J., et al., "Growth and characterization of GaAs and InAs nano-whiskers and InAs/GaAs heterostructures", *Physica E*, Mar. 1, 2002, pp. 1126-1130, No. 13.

Samuelson, L., et al., "Tunnel-Induced Photon Emission in Semiconductors Using an STM", *Physica Scripta*, Jan. 1, 1992, pp. 149-152, vol. T42.

Seifert, W. et al, "In-Situ Growth of Quantum Dot Structures by the Stranski-Krastanow Growth Mode", *Prog. Crys. Growth Charact.*, Jan. 1, 1996, pp. 423-471, vol. 33.

Persson, M., "Tight-Binding Simulation of Nanocrystalline Particles and Whiskers", *Tekn lic thesis, Lund University*, Aug. 1, 2002.

Bjork, M., "Semiconductor Nanowires and Devices", *Tekn lic thesis, Lund University*, Nov. 1, 2002.

Murphy, C.J., et al., "Controlling the Aspect Ratio of Inorganic Nanorods and Nanawires", *Advanced Materials*, Jan. 2, 2002, pp. 80-82, vol. 14, No. 1.

Wagner, R.S., et al., "Vapour-Liquid-Solid Mechanism of Single Crystal Growth", *Applied Physics Letters*, Mar. 1, 1964, pp. 89-90, vol. 4, No. 5.

Canham, L.T., "Silicon Quantum Wire Array Fabrication by Electrochemical and Chemical Dissolution of Wafers", *Applied Physics Letters*, Sep. 3, 1990, pp. 1046-1048, vol. 57.

Koga, T., et al., "Carrier Pocket Engineering Applied to Strained . . . ", *Applied Physics Letters*, Oct. 18, 1999, pp. 2438-2440, vol. 75.

Koga, T., et al., "Experimental Proof-of-Principle Investigation of Enhanced $Z_{3d}T$ in (001) Oriented Si/Ge Superlattices", *Applied Physics Letters*, Sep. 4, 2000, pp. 1490-1492, vol. 77, No. 10.

Narihiro, M., et al., "Resonant tunneling of electrons via 20 nm scale InAs quantum dot and magnetotunneling spectroscopy of its electronic states", *Applied Physics Letters*, Jan. 6, 1997, pp. 105-107, vol. 70, No. 1.

Pan, Z., et al., "Conduction band offset and electron effective mass in GaInNAs/GaAs quantum-well structures with low nitrogen concentration", *Applied Physics Letters*, Apr. 9, 2001, pp. 2217-2219, vol. 78, No. 15.

Ferry, D.K., et al., "Transport in Nanostructures", *Cambridge University Press*, Hardcover, Jan. 1, 1997, pp. 41-45 and 91-96.

Givargizov, E., "Growth of Whiskers by the Vapor-Liquid-Solid Mechanism", *Current Tonics in Material Science*, edited by E. Kaldis, Jan. 1, 1978, pp. 79-145, Chapter 3, vol. 1.

Mullins, J., "News analysis: using unusable frequencies", *IEEE Spectrum*, Jul. 1, 2002, pp. 22-23, vol. 39, No. 7.

Randall, J.N., et al., "Quantum Dot Devices", in Norman G. Einsgruch and William R. Frensley, eds., Heterostructures and Quantum Devices (San Diego, CA: Academic Pres, Inc., 1994) Copyright 1994, p. 420.

Markowitz, P.D., et al., "Phase Separation in $Al_xGa_{1-x}As$ Nanowhiskers Grown by the Solution-Liquid-Solid Mechanism", *J. Am. Chem. Soc.*, Apr. 18, 2001, pp. 4502-4511, vol. 123.

Hickmott, T.W., et al., "Negative Charge, Barrier Heights, and the Conduction-Ban Discontinuity in $Al_xGa_{1-x}As$ Capacitors", *Journal of Applied Physics*, Apr. 15, 1985, pp. 2844-2853, vol. 57.

Matthews, J., et al., "Defects in Expitaxial Multillayers", *Journal of Crystal Growth*, Jan. 1, 1974, pp. 118-125, vol. 27.

Kovtyukhova, N., et al., "Layer-by-Layer Assembly Rectifying Junctions in and on Metal Nanowires", *Journal of Physical Chemistry B*, Aug. 14, 2001, pp. 8762-8769, vol. 105.

Sakaki, H., "Scattering Suppression and High-Mobility Effect of Size-Quantized Electrons in Ultrafine Semiconductor Wire Structures", *Japanese Journal of Applied Physics*, Dec. 1, 1980, pp. L735-L738, vol. 19, No. 12.

Scheibel, H., et al., "Generation of Monodisperse Ag- and NaCl Aerosols With Particle Diameters Between 2 and 300 nm", *Journal of Aerosol Science*, Jan. 1, 1983, pp. 113-126, vol. 14, No. 2.

Knutson, E., et al., "Aerosol Classification by Electric Mobility: Apparatus, Theory, and Applications", *Journal of Aerosol Science*, Jan. 1, 1975, pp. 443-451, vol. 6.

Miller, M., et al., "Serpentine Superlattice: Concept and First Results", *Journal of Crystal Growth*, Jan. 1, 1991, pp. 323-327, vol. 111.

Bhat, R., et al., "Patterned Quantum Well Heterostructures Grown by OMCVD on Non-Planar Substrates: Applications to Extremely Narrow SQW Lasers", *Journal of Crystal Growth*, Jan. 1, 1988, pp. 850-856, vol. 93.

Hara, S., et al, "Formation and Photoldnescence Characterization of Quantum Well Wires Using Multiatdc Steps Grown by Metalorganic Vapor Phase Epitaxy", *Journal of Crystal Growth*, Jan. 1, 1994, pp. 692-697, vol. 145.

Givargizov, E.I., "Fundamental Aspects of VLS Growth", *Journal of Crystal Growth*, Jan. 1, 1975, pp. 20-30, vol. 31.

Derycke, V., et al., "Carbon Nonotube Inter- and Intramolecular Logic Gates", *Nano Letters*, Aug. 26, 2001, pp. 453-456, vol. 1, No. 9.

Iijima, S., "Helical microtubules of graphitic carbon", *Nature*, Nov. 7, 1991, pp. 56-58, vol. 354.

Yao, Z., et al., "Carbon Nanotubes Intramolecular Junctions", *Nature*, Nov. 18, 1999, pp. 273-276, vol. 402.

Bennett, C., et al., "Quantum information and computation", *Nature*, Mar. 16, 2000, pp. 247-255, vol. 404.

Michler, P. et al., "Quantum correlation among photons from a single quantum dot at room temperature", *Nature*, Aug. 31, 2000, pp. 968-970, vol. 406, No. 6799.

Chow, E., et al., "Three-dimensional control of light in a two-dimensional photonic crystal slab", *Nature*, Oct. 26, 2000, pp. 983-986, vol. 407.

Venkatasubramanian, R., et al., "Thin-Film Thermoelectric Devices with High Room-Temperature Figures of Merit", *Nature*, Oct. 11, 2003, pp. 597-602, vol. 413.

Bachtold, A., et al., "Scanned probe microscopy of electronic transport in carbon nanotubes", *Phys. Rev. Lett.*, Jun. 26, 2000, pp. 6082-6085, vol. 84, No. 26.

Hicks, L.D., et al., "Thermoelectric Figure of Merit of a One-Dimensional Conductor", *Physical Review B*, Jun. 15, 1993, pp. 16631-16634, vol. 47, No. 24.

Itskevich, I.E., et al., "Resonant magnetotunneling through individual self-assembled InAs quantum dots", *Physical Review B*, Dec. 15, 1996, pp. 16401-16404, vol. 54, No. 23.

Reed, M.A., et al., "Observation of Discrete Electronic States in a Zero-Dimensional Semiconductor Nanostructure", *Physical Review Letters*, Feb. 8, 1988, pp. 535-537, vol. 60, No. 6.

Kapon, E., et al., "Stimulated Emission in Semiconductor Quantum Wire Heterostructures", *Physical Review Letters*, Jul. 24, 1989, pp. 430-433, vol. 63, No. 4.

Santori, C., et al., "Triggered Single Photons from a Quantum Dot", *Physical Review Letters*, Feb. 19, 2001, pp. 1502-1505, vol. 86, No. 8.

Capasso, F., et al., "Quantum Cascade Lasers", *Physics Today*, May 1, 2002, pp. 34-40.

Likharev, K.K., "Single-Electron Devices and their Applications", *Proceedings of the IEEE*, Apr. 1, 1999, pp. 606-632, vol. 87, No. 4.

Han, W., et al., "Synthesis of Gallium Nitride Nanorods Throuah a Carbon Nanotube-Confined Reaction", *Science*, Aug. 29, 1997, pp. 1287-1289, vol. 277.

Zhang, Y., et al., "Heterostructures of Single-Walled Carbon Nanotubes and Carbide Nanorods", *Science*, Sep. 10, 1999, pp. 1719-1722, vol. 285.

Holmes, J., et al., "Control of Thickness and Orientation of Solution-Grown Silicon Nanowires", *Science*, Feb. 25, 2000, pp. 1471-1473, vol. 287.

Zhou, C.W., et al., "Modulated chemical doping of individual carbon nanotubes", *Science*, Nov. 24, 2000, pp. 1552-1555, vol. 290.

Favier, F., et al., "Hydrogen Sensors and Switches from Electrodeposited Palladium Mesowire Arrays", *Science*, Sep. 21, 2001, pp. 2227-2231, vol. 293.

Bachtold, A., et al., "Logic circuits with carbon nanotube transistors", *Science*, Nov. 9, 2001, pp. 1317-1320, vol. 294.

Nicewarner-Pena, S.R., et al., "Submicrometer metallic barcodes", *Science*, Oct. 5, 2001, pp. 137-141, vol. 294.

Service, R.F., "Nanowire Fabricators Earn Their Stripes", *Science*, Jan. 1, 2002, pp. 946-947, vol. 295, No. 5557.

Awschalom, D.D. et al., "Spintronics", *Scientific American*, Jun. 1, 2002, pp. 66-73, vol. 286, No. 6.

Henning, P., et al., "Compositional information from amorphous Si-Ge multilayers using high-resolution electron microscopy imaging and direct digital recording", *Ultramicroscopy*, Jan. 1, 1996, pp. 221-235, vol. 66.

Wagner, R.S., "VLS Mechanism of Crystal Growth", *Whisker Technology*, A.P. Levitt, ed., Chapter 3, Jan. 1, 1970, pp. 47-119.

Alferov, Z., et al., "For developing semiconductor heterostructures used in high-speed-and opto-electronics", Nov. 23, 2000, www.nobel.se.physics/laureates/2000/.

Von Klitzing, K., "For the discovery of the quantized Hall effect", Jun. 16, 2000, www.nobel.se/physics/laureates/1985/.

Laughlin, R.B., et al., "For their discovery of a new form of quantum fluid with frictionally charged excitations", Jun. 16, 2000, www.nobel.se/physics/laureates/1998/.

Oda, Y., et al., "Natural Formation of Square Scale Structures on Patterned Vicinal Substrates by MOVPE: Application to the Fabrication of Quantum Structures", *Phys. Conf. Ser.*, No. 166, Chapter 4, Aug. 22-26, 1999, pp. 191-194.

Hayakawa, K., et al., "AlGaAs Nano-Meter Scale Network Structures Fabricated by Selective Area MOVPE", *Phys. Conf. Ser.*, No. 162, Chapter 8, Oct. 12-16, 1998.

Akabori, M., et al., "Selective Area MOVPE Growth of Two-Dimensional Photonic Crystals Having an Air-Hole Array and its Application to Air-Bridge-Type structure", *Physica E*, No. 13, Jan. 1, 2002, pp. 446-450.

Melechko, A.V., et al., "Large-Scale Synthesis of Arrays of High-Aspect-Ratio Rigid Vertically Aligned Carbon Nanofibres", *Nanotechnology*, No. 14, Aug. 19, 2003, pp. 1029-1035.

Kempa, K., et al., "Photonic Crystals Based on Periodic Arrays of Aligned Carbon Nanotubes", *Nano Letters*, Nov. 19, 2002, pp. 13-18,vol. 3, No. 1.

Takahashi, H., et al., "Formation and Characteristics of 100 nm Scale GaAs Quantum Wires by Selective Area MOVPE", *Applied Surface Science*, No. 216, Jan. 1, 2003, pp. 402-406.

Akabori, M., et al., "InGaAs Nano-Pillar Array Formation on Partially Masked InP(111)B by Selective Area Metal-Organic Vapour Phase Egitaxial Growth for Two-Dimensional Photonic Crystal Application", *Nanotechnology*, No. 14, Aug. 27, 2003, pp. 1071-1074.

Kamins, T.I., et al., "Self-Assembled Silicon Nanowires for Integrating Microsystems, Nanoelectronics and Microelectronics", *mstnews*, Mar. 2003, Mar. 1, 2003.

Wu, Y., et al., "Rational Synthesis of Inorganic Nanowires", *Abstracts of Papers in the Amer. Chem. Soc.*, Apr. 1, 2001, pp. 108-Iec Part 1, vol. 221.

Yang, P., et al., "Nanowires from Vapor Condensation and their Assemblies", *Abstracts of Papers in the Amer. Chem. Soc.*, Mar. 26, 2000, pp. 269-Inor Part 1, vol. 219.

Huang, M., et al., "Nanowire Array as Potential 2-d Photonic Bandgap Materials", *Abstracts of Paners in the Amer. Chem. Soc.*, Apr. 1, 2001, pp. 95-Phys Part 2, vol. 221.

Yang, P., et al., "Inorganic Nanowires: Rational Synthesis, Functional Assemblies and Novel Properties", *Abstracts of Papers in the Amer. Chem. Soc.*, Apr. 7, 2002, pp. 343-Inor Part 2, vol. 223.

Gates, B., et al., "Synthesis and Characterization of Crystalline Ag2Se Nanowires through a Template-Engaged Reaction at Room Temperature", *Advanced Fun. Materials*, Oct. 1, 2002, pp. 679-686, vol. 12, No. 10.

Yang, P., et al., "Controlled Growth of ZnO Nanowires and their Optical Properties", *Advanced Functional Materials*, May 2002, pp. 323-331, vol. 12, No. 5.

Wu, Y., et al., "Superconducting MgB2 Nanowires", *Advanced Materials*, Oct. 2, 2001, pp. 1487-1489, vol. 13, No. 19.

Huang, M., et al., "Catalytic Growth of Zinc Oxide Nanowires by Vapor Transport", Advanced Materials, Jan. 16, 2001, pp. 113-116, vol. 13, No. 2.

Wu, Y., et al., "Melting and Welding Semiconductor Nanowires in Nanotubes", *Advanced Materials*, Apr. 4, 2001, pp. 520-523, vol. 13, No. 7.

Zheng, B., et al., "Synthesis of Ultra-Long and Highly Oriented Silicon Oxide Nanowires from Liquid Alloys", *Advanced Materials*, Jan. 16, 2002, pp. 122-124, vol. 14, No. 2.

Kind, H., et al., "Nanowire Ultraviolet Photodetectors and Optical Switches", *Advanced Materials*, Jan. 16, 2002, pp. 158-160, vol. 14, No. 2.

Xia, Y., et al., "Chemistry and Physics of Nanowires", *Advanced Materials*, Mar. 4, 2003, pp. 351-352, vol. 15, No. 5.

Xia, Y., et al., "One-Dimensional Nanostructures: Synthesis, Characterization, and Applications", *Advanced Materials*, Mar. 4, 2003, pp. 353-389, vol. 15, No. 5.

Yan, H., et al., Morphogensis of One-Dimensional ZnO Nano- and Microcrystalsm, *Advanced Materials*, Mar. 4, 2003, pp. 402-405, vol. 15, No. 5.

Wu, Y., et al., "Germanium/Carbon Core-Sheath Nanostructures", *Applied Physics Letters*, Jul. 3, 2000, pp. 43-45, vol. 77, No. 1.

Wu, Y., et al., "Inorganic Semiconductor Nanowires: Rational Growth, Assembly, and Novel Properties", *Chemistry-A European Journal*, Mar. 15, 2002, pp. 1261-1268, vol. 8, No. 6.

Yang, P., et al., "Langmuir-Blodgett Assembly of One-Dimensional Nanostructures", *Chemphyschem*, Jun. 17, 2002, pp. 503-506, vol. 3, No. 6.

Wu, Y., et al., "Direct Observation of Vapor-Liquid-Solid Nanowire Growth", *J. Am. Chem. Soc.*, Mar. 13, 2001, pp. 3165-3166, vol. 123.

Yan, H., et al., "Dendritic Nanowire Ultraviolet Laser Array", *J. Am. Chem. Soc.*, Mar. 29, 2003, pp. 4728-4729, vol. 125, No. 16.

Johnson, J., et al., "Single Nanowire Lasers", *Journal of Physical Chemistry B*, Oct. 23, 2001, pp. 11387-11390, vol. 105, No. 46.

Messer, B., et al., "Microchannel Networks for Nanowire Patterning", *Journal of the Amer. Chem. Soc.*, Sep. 29, 2000, pp. 10232-10233, vol. 122, No. 41.

Song, J., et al., "MMo$_3$Se$_3$ (M=Li+,Na+, Rb+,Cs+, NMe4+) Nanowire Formation via Cation Exchange in Organic Solution", *Journal of the Amer. Chem. Soc.*, Mar. 10, 2001, pp. 9714-9715, vol. 123, No. 39.

Li, Y., et al, "Bismuth Nanotubes: A Rational Low-Temperature Synthetic Route", Journal of the Amer. Chem. Soc., Sep. 14, 2001, pp. 9904-9905, vol. 123, No. 40.

Song, J., et al., "Metal Nanowire Formation Using Mo$_3$Se$_3$—as Reducing and Sacrificing Templates", Journal of the Amer. Chem. Soc., Sep. 26, 2001, pp. 10397-10398, vol. 123, No. 42.

Gates, B., et al., "Single-Crystalline Nanowires of Ag2Se Can Be Synthesized by Templating Against Nanowires of Trigonal Se", *Journal of the Amer. Chem. Soc.*, Oct. 25, 2001, pp. 11500-11501, vol. 123, No. 46.

Wu, Y., et al., "Block-by-Block Growth of Single-Crystalline Si/SiGe Superlattice Nanowires", *Nano Letters*, Jan. 19, 2002, pp. 83-86, vol. 2, No. 2.

Johnson, J., et al., "Near-Field Imaging of Nonlinear Optical Mixing in Single Zinc Oxide Nanowires", *Nano Letters*, Apr. 1, 2002, pp. 279-283, vol. 2, No. 4.

Johnson, J., et al., "Single Gallium Nitride Nanowires Lasers", *Nature Materials*, Sep. 15, 2002, pp. 106-110, vol. 1, No. 2.

Huang, M.H., et al., "Room-Temperature Ultraviolet Nanowire Nanolasers", *Science*, Jun. 8, 2001, pp. 1897-1899.

Wu, Y., et al., "Germanium Nanowire Growth via Sample Vapor Transport", *Chem. Mater*, Mar. 20, 2000, pp. 605-607, vol. 12.

Wu, Y., et al., "Semiconductor Nanowire Array: Potential Substrates for Photocatalysis and Photovoltaics", *Topics in Catalysis*, Apr. 1, 2002, pp. 197-202, vol. 19, No. 2.

Hiruma, K., et al., "GaAs free-standing quantum-size wires", *Journal of Applied Physics*, Sep. 1, 1993, pp. 3162-3171, vol. 74.

Liu J.L., et al., "Gas-source MBE growth of freestanding Si nanowires on Au/S1 substrate", *Superlattices Microstructures*, 1999, pp. 477-479, vol. 25, No. 1-2.

Shimada, et al., "Size, position and direction control on GaAs and InAs nanowhisker growth", *Superlattices and Microstructures*, Dec. 1998, pp. 453-458, vol. 24, No. 6.

Shirai, M., et al., "Gold cluster formation using an atomic force microscope and its applications to GaAs whisker growth", *Superlattices and Microstructures*, Aug. 1998, pp. 157-162, vol. 24, No. 2.

Hiruma, K., et al., "Gas and InAs Nanowire Growth Technology", *Proceedings of the Science and Technology of Atomically Engineered Materials*, Oct. 30, 1995, pp. 563-570.

Westwater, J., et al., "Control of the size and position of silicon nanowires grown via the vapor-liquid-solid technique", *Japanese Journal of Applied Physics*, Part 1, Oct. 1997, pp. 6204-6209, vol. 36.

O'Regan, et al., "A Low-Cost, High-Efficiency Solar Cell Based on Dye-Sensitized Colloidal TiOa Films", *Nature*, Oct. 24, 1991, pp. 737-740, vol. 353.

Jun, et al., "Architectural Control of Magnetic Semiconductor Nanocrystals", *J. Am. Checm Soc.*, Jan. 4, 2002, pp. 615-619, vol. 124, No. 4.

Manna, et al., "Synthesis of Soluble and Processable Rod-, Arrow-, Teardrop-, and Tetrapod-Shaped CdSe Nanocrystals", *J. Am. Chec. Soc.*, Dec. 1, 2000, pp. 12700-12706, vol. 122, No. 51.

Huang, et al., "Directed Assembly of one-dimensional nanostructures into functional networks", *Science*, Jan. 26, 2001, pp. 630-633, vol. 291.

Persson, "Heterointerfaces in III-V semiconductor nanowhiskers", *IEEE*, 2002, pp. 281-283.

Gao, et al., "Self-Assembled Nanowire-Nanoribbon Junction Arrays of ZnO", *The Journal of Physical Chemistry*, Nov. 12, 2002, pp. 12653-12658, vol. 106, No. 49.

Jun, et al., "Controlled Synthesis of Multi-Armed CdS Nanorod Architectures Using Monosurfactant System", *J. Am. Chem. Soc.*, May 5, 2001, pp. 5150-5151, vol. 123.

Poole, et al., "Spatially Controlled, Nanoparticle-Free Growth of InP Nanowires", *Applied Physics Letters*, Sep. 8, 2002, pp. 2055-2057, vol. 83, No. 10.

Hiruma et al., "Quantum Size Microcrystals Grown Using Organametallic Vapor Phase Epitaxy", *Appl. Phys. Lett.*, vol. 59, No. 4, Jul. 22, 1991, pp. 431-433.

Ozaki et al., "Silicon Nanowhiskers Grown on a Hydrogen-Terminated Silicon (111) Surface", *Applied Physics Letters*, vol. 73, No. 25, Dec. 21, 1998, pp. 3700-3702.

Wu et al., "Growth, Branching, and Kinking of Molecular-Beam Epitaxial <110> GaAs Nanowires", *Applied Physics Letters*, vol. 83, No. 16, Oct. 20, 2003, pp. 3368-3370.

Grätzel, "Photoelectrochemical Cells", *Nature*, vol. 414, Nov. 15, 2001, pp. 338-344.

Wang et al., "Nanocrystals Branch Out", *Nature Materials*, vol. 2, Jun. 2003, pp. 385-386.

Manna et al., "Controlled Growth of Tetrapod-Branched Inorganic Nanocrystals", *Nature Materials*, vol. 2, Jun. 2003, pp. 382-385.

Wang et al., "Rational Growth of Branched and Hyperbranched Nanowire Structures", *Nano Letters*, vol. 4, No. 5, Mar. 31, 2004.

Dick et al., "Synthesis of Branched 'Nanotrees' by Controlling Seeding of Multiple Branching Events", *Nature Materials*, vol. 3, May 2, 2004.

Oda et al., "Natural Formation of Square Scale Structures on Patterned Vicinal Substrates by MOVPE: Application to the Fabrication of Quantum Structures", *Inst. Phys. Conf. Ser.*, No. 166, Chapter 4, Aug. 22, 1999, pp. 191-194.

Akabori et al., "Selective Area MOVPE Growth of Two-Dimensional Photonic Crystals Having an Air-Hole Array and its Application to Air-Bridge-Type Structures", *Physica E*, No. 13, 2002, pp. 446-450.

Melechko et al., "Large-Scale Synthesis of Arrays of High-Aspect-Ratio Ridig Vertically Aligned Carbon Nanofibres", *Nanotechnology*, No. 14, Aug. 19, 2003, pp. 1029-1035.

Wu et al., "Single-Crystal Metallic Nanowires and Metal/Semiconductor Nanowire Heterostructures", *Nature*, vol. 430, Jul. 1, 2004, pp. 61-65.

Zhong et al., "Nanowire Crossbar Arrays as Address Decoders for Integrated Nanosystems" *Science*, vol. 302, Nov. 21, 2003, pp. 1377-1379.

McAlpine et al., "High-Performance Nanowire Electronics and Photonics on Glass and Plastic Substrates", *Nano Letters*, vol. 3, No. 11, Oct. 14, 2003, pp. 1531-1535.

Greytak et al., "Growth and Transport Properties of Complementary Germanium Nanowire Field-Effect Transistors", *Applied Physics Letters*, vol. 84, No. 21, May 24, 2004, pp. 4176-4178.

Whang et al., "Large-Scale Hierarchical Organization of Nanowire Arrays for Integrated Nanosystems", *Nano Letters*, vol. 3, No. 9, Aug. 5, 2003, pp. 1255-1259.

McAlpine et al., "Nanoimprint Lithography for Hybird Plastic Electronics", *Nano Letters*, vol. 3, No. 4, Mar. 7, 2003, pp. 443-445.

Bozovic et al., "Plastic Deformation in Mechanically Strained Single-Walled Carbon Nanotubes", *Physical Review B*, vol. 57, Jan. 22, 2003, pp. 033407-1-033407-4.

Hahm et al., "Direct Ultrasensitive Electrical Detection of DNA and DNA Sequence Variations Using Nanowire Nanosensors", *Nano Letters*, vol. 4, No. 1, Dec. 9, 2003, pp. 51-54.

Lieber, "Nanoscale Science and Technology: Building a Big Future from Small Things", MRS Bulletin, Jul. 2003, pp. 486-491.

Yu et al., "Silicon Nanowires: Preparation, Device Fabrication, and Transport Properties", *J. Phys. Chem. B.*, vol. 104, No. 50, Nov. 23, 2000, pp. 11864-11870.

Law et al., "Photochemical Sensing of $NO_2$ with $SnO_2$ Nanoribbon Nanosensors at Room Temperature", *Angew. Chem. Int. Ed.*, vol. 41, No. 13, 2002, pp. 2405-2408.

Lao et al., "Hierarchical ZnO Nanostructures", *Nano Letters*, vol. 2, Sep. 13, 2002, pp. 1287-1291.

Barrelet et al., "Synthesis of CdS and ZnS Nanowires Using Single-Source Molecular Precursors", *J. Am. Chem. Soc.*, vol. 125, 2003, pp. 11498-11499.

Björk et al., "Few-Electron Quantum Dots in Nanowires", *Nano Letters*, vol. 4, No. 9, Jul. 28, 2004, pp. 1621-1625.

Martensson et al., "Nanowire Arrays Defined by Nanoimprint Lithography", *Nano Letters*, vol. 4, Mar. 17, 2004, pp. 699-702.

Hornstra, "Dislocations in the Diamond Lattice", *J. Phys. Checm. Solids*, vol. 5, 1958, pp. 129-141.

Krost et al., "InP on Si(111): Accommodation of Lattice Mismatch and Structural Properties", *Appl. Phys. Lett.*, vol. 64, No. 7, Feb. 7, 1994, pp. 769-771.

Gorbach et al., "Growth of III-V Semiconductor Layers on Si Patterned Substrates", *Thin Solid Films*, vol. 336, 1998, pp. 63-68.

Ohlsson et al., "Anti-Domain-Free GaP, Grown in Atomically Flat (001) Si Sub-μm-sized Openings", *Applied Physics Letters*, vol. 80, No. 24, Jun. 17, 2002, pp. 4546-4548.

Kawanami, "Heteroepotaxial Technologies of III-V on Si", *Solar Energy Materials & Solar Cells*, vol. 66, 2001, pp. 479-486.

Westwater et al., "Growth of Silicon Nanowires via Gold/Silane Vapor-Liquid-Solid Reaction", *J. Vac. Sci. Technol. B.*, vol. 15, No. 3, 1997, pp. 554-557.

Kamins et al., "Ti-Catalyzed Si Nanowjres by Chemical Vapor Deposition: Microscopy and Growth Mechanisms", *Journal of Applied Physics*, vol. 89, No. 2, Jan. 15, 2001, pp. 1008-1016.

Schubert et al., "Silicon Nanowhiskers Grown on <111> Si Substrates by Molecular-Bean Epitaxy", *Applied Physics Letters*, vol. 84, No. 24, Jun. 14, 2004, pp. 4968-4970.

Kamins et al., "Growth and Structure of Chemically Vapor Deposited Ge Nanowires on Si Substrates", *Nano Letters*, vol. 4, No. 3, Jan. 23, 2004, pp. 503-506.

Thornton et al., "A Photoemission Study of Passivated Silicon Surfaces Produced by Etching in Solutions of HF", *Semicond. Sci. Technol.*, vol. 4, 1989, pp. 847-851.

Borgstrom et al., "Size- and Shape-Controlled GaAs Nano-Whiskers Grown by MOVPE: A Growth Study", *Journal of Crystal Growth*, vol. 260, 2004, pp. 18-22.

Westwater et al., "Si Nanowires Grown via the Vapour-Liquid-Solid Reaction", *Phys. Stat. Sol.*, vol. (a)165, 1998, pp. 37-42.

Westwater et al., "The Characteristics and Oxidation of Vapor-Liquid-Solid Grown Si Nanowires", *Mat. Res. Soc. Symp. Proc.*, vol. 452, 1997, pp. 237-242.

Westwater et al., "Nanoscale Silicon Whiskers Formed by Silane/Gold Reaction at 335° C", *Materials Letters*, vol. 24, Jun. 1995, pp. 109-112.

Yang, "Semiconductor Nanowire Array", *Proceedings of the SPIE*, vol. 4806, 2002, pp. 222-224.

Kuykendall et al., "Crystallographic Alignment of High-Density Gallium Nitride Nanowire Arrays", *Nature Materials*, vol. 3, Jul. 25, 2004, pp. 524-528.

Abramson et al., "Fabrication and Characterization of a Nanowire/Polymer-Based Nanocomposite Prototype Thermoelectric Device", *Journal of Microelectromechanical Systems*, vol. 13, for a No. 3, Jun. 2004, pp. 505-513.

Abramson et al., "Nanowire Composite Thermoelectric Devices", *Proceedings of IMECE 2002, ASME International Mechanical Engineering Congress & Exposition*, Nov. 17-22, 2002, pp. 7-11.

Johnson et al., "Single Nanowire Waveguides and Lasers", *Proceedings of SPIE*, vol. 5223, 2003, pp. 187-196.

Greene et al., "Low-Temperature Wafer-Scale Production of ZnO Nanowire Arrays", *Angew. Chem. Int. Ed.*, vol. 42, 2003, pp. 3031-3034.

Kim et al., "Nanowire Arrays for Thermoelectric Devices", *Proceedings of HT2003, ASME Summer Heat Transfer Conference*, Jul. 21-23, 2003, pp. 101-104.

Choi et al., "Self-Organized GaN Quantum Wire UV Lasers", *J. Phys. Chem. B.*, vol. 107, 2003, pp. 8721-8725.

Yang, "From Nanowire Lasers to Quantum Wire Lasers", *Proceedings of SPIE*, vol. 5349, 2004, pp. 18-23.

Mikkelsen et al., "Direct Imaging of the Atomic Structure Inside a Nanowire by Scanning Tunneling Microscopy", *Nature Materials*, vol. 3, Jul. 4, 2004, pp. 519-523.

Thelander et al., "Electron Transport in InAs Nanowires and Heterostructure Nanowire Devices", *Solid State Communications*, vol. 131, Jun. 11, 2004, pp. 573-579.

Samuelson et al., "Semiconductor Nanowires for Novel One-Dimensional Devices", *Physica E*, vol. 21, 2004, pp. 560-567.

Shorubalko et al., "Tunable Nonlinear Current-Voltage Characteristics of Three-Terminal Ballistic Nanojunctions", *Applied Physics Letters*, vol. 83, No. 12, Sep. 22, 2003, pp. 2369-2371.

Samuelson et al., "Fabrication and Spectroscopic Studies of InP/GaInAs/Inp and GaAs/GaInAs/GaAs Quantum-Well Wire Structures", *Inst. Phys. Confer. Ser.* No. 127, Chapter 3, Jan. 1, 1992, pp. 95-98.

Samuelson et al., "Fabrication and Imaging of Quantum Well Wire Structures", *SPIE*, vol. 1676, 1992, pp. 154-160.

Larsson et al., "Probing of Individual Semiconductor Nanowhiskers by TEM-STM", *Microscopy and Microanalysis*, vol. 10, 2004, pp. 41-46.

Ramvall et al., Quantized Conductance in a Heterostructurally Defined $Ga_{0.25}In_{0.75}As/InP$, *Appl. Phys. Lett.*, vol. 71, Aug. 18, 1997, pp. 918-920.

Ng et al., "Growth of Epitaxial Nanowires at the Junctions of Nanowalls", *Science*, vol. 300, May 23, 2003, p. 12.

Ng et al., "Epitaxial Single Crystalline Inorganic Nanowires and Nanowalls: Growth Morphogenesis and Applications in Nano-Optoelectronics", *Proceedings of SPIE*, vol. 5349, 2004, pp. 11-17.

Ng et al., "Three Dimensional Columnar Optical Nanostructures Fabricated by Using Lithography-Free Templating Approach", *Applied Physics Letters*, vol. 84, No. 15, Apr. 12, 2004, pp. 2898-2900.

Thelander et al., "One Dimensional Heterostructures and Resonant Tunneling in III-V Nanowires", *IEEE International Symposium on Compound Semiconductors*, Aug. 25, 2003, pp. 151-152.

Björk et al., "Heterostructures in One-Dimensional Nanowires", *Proceedings of 7th International Conference of Nanometer-Scale Science and Technology and 21st European Conference on Surface Science*, Jun. 24, 2002.

Ohlsson et al., "Comparison Between (111)B and (100)III-V Nanowhiskers", Proceedings of $7^{th}$ International Conference of Nanometer-Scale Science and Technology and 2Ist European Conference on Surface Science, Jun. 24, 2002.

Larsson et al, In-Situ Manipulations and Electrical Measurements of III-V Nanowhiskers with TEM-STM, Proceedings of $7^{th}$ International Conference of Nanometer-Scale Science and Technology and $21^{st}$ European Conference on Surface Science, Jun. 24, 2002.

Persson et al., "Solid-phase-diffusion mechanism for GaAs nanowire growth", *Nature Materials*, vol. 3, Oct. 2004, pp. 677-681.

Ng et al., "Single Crystal Nanowire Vertical Surround-Gate-Filed-Effect Transistor", *Nano Letters*, vol. 4, No. 7, May 29, 2004, pp. 1247-1252.

Lieber et al., "Nanowires as Building Blocks for Nanoelectronics and Nanophotonics", *Electron Devices Meeting 2003 IEEE International*, 2003, pp. 12.3.1-12.3.3.

Martensson et al., "Epitaxial-III-V Nanowires on Silicon", *Nano Letters*, vol. 4, No. 10, Sep. 23, 2004, pp. 1987-1990.

Jensen et al., "Role of Surface Diffusion in Chemical Beam Epitaxy of InAs Nanowires", *Nano Letters*, vol. 4, No. 10, Sep. 14, 2004, pp. 1961-1964.

* cited by examiner

LED WITH UPSTANDING NANOWIRE STRUCTURE AND METHOD OF PRODUCING SUCH

TECHNICAL FIELD

The present invention relates to light emitting diodes, LEDs. In particular the invention relates to a LED comprising a nanowire as an active component.

BACKGROUND

The majority of present day light emitting diodes (LEDs) are built on planar technology. The PN-junction is constructed as a plurality of layers on a substrate giving a device with an essentially horizontal orientation. The light-producing re-combination takes place in one of the layers. As the layer has a refractive index that is substantially higher than the refractive index of the air, a substantial portion of generated light will be reflected in the layer and not contribute to the effective luminescence of the device. In fact the layer will act as a waveguide in the horizontal plane of the LED. Measures have been suggested to mitigate the effects of the light of LED being trapped in the device and to efficiently extract the light out of the semiconductor layers. Such measures include modifying the surface in order to provide portions with varying angles to the horizontal plane. A similar approach is suggested in EP1369935, wherein nanosized particles are provided in the LED device to scatter light or alternatively absorb light and generate light of a different wavelength. In addition the planar technology imposes constrains in terms of miniaturization and choices of suitable materials, which will be further described below.

The development of nanoscale technology and in particular the ability to produce nanowires have opened up possibilities of designing structures and combining materials in ways not possible in planar technology. One basis for this development is that the 1D properties of a nanowire makes it possible to overcome the requirement of lattice matching between different materials in a device made with planar technology. It has been shown and utilized that nanowires of for example InP can be grown on InAs or Si without defects. In US Published Application 2004/0075464 by Samuelson et al a plurality of devices based on nanowire structures are disclosed, for example nanowire LEDs. These LEDs have an internal heterostructure giving quantum confinement effects.

US Published Application 2003/0168964 teaches an assembly of a plurality of nanowires acting as LEDs mounted in groups between a conductive transparent substrate at the lower end of the nanowires and a transparent cover substrate at the top end, each individual nanowire having a structure of P-type, N-type and light emitting layer. The nanowires are said to be arranged to emit light through the conductive transparent substrate.

Other nanowire LED have previously been reported. Hiruma et al. fabricated vertical GaAs nanowire pn LEDs. The nanowires were embedded in a SOG and covered with an Au/Ge/Ni top contact, as described in "*GaAs p-n junction formed in quantum crystals*" by Haraguchi et al., Appl. Phys. Lett. 60 (6) 1992. These devices showed room temperature electro luminescence. GaN based nanowire LEDs have also been fabricated as described in "*Core/Multishell Nanowire Heterostructure as Multicolor, High-Efficiency Light-Emitting Diodes*" by F. Qian et al., recently published in the journal Nano Letters.

SUMMARY OF THE INVENTION

It has been shown that nanowires can be utilized for constructing LEDs. To provide efficient devices suitable for industrial production methods further improvements are needed The embodiments of the present invention provide a nanostructured LED and a method of producing such LED which overcome the drawbacks of the prior art devices and methods.

The nanostructured LED according to the embodiments of the invention comprises a substrate and at an upstanding nanowire protruding from the substrate. A pn-junction giving an active region to produce light is present within the structure during use. The nanowire or at least a part of the nanowire, forms a wave-guiding section (116) directing at least a portion of the light produced in the active region in a direction given by the nanowire.

The nanostructured LED may further comprise a volume element epitaxially connected to the nanowire. The volume element provides a high doping degree for the formation of the active region, typically within or close to the nanowire, without requiring the nanowire itself to be doped.

The waveguiding properties of the nanowire can be improved in different ways. The nanowire has a first effective refractive index, $n_W$, and the material surrounding at least a portion of the nanowire has a second effective refractive index, $n_C$, and by assuring that the first refractive index is larger than the second refractive index, $n_W > n_C$, good waveguiding properties are provided to the nanowire. The waveguiding properties may be further improved by introducing optically active cladding layers on the nanowire.

Thus, it is possible to make use of a very large portion of the produced light, whereby effective LEDs can be provided. This is at least partly achieved by the nanowire being used as a waveguide, directing the produced light out of the surface. The nanostructured LED according to the embodiments of the invention is well suited for mass production, and the method described scaleable to industrial use.

The use of the nanowire as a waveguide offers a possibility to direct light in well defined directions. By using concepts from the area of fiber optics light beams can be focused, or dispersed, depending on the intended use.

The nanowire technology offers possibilities in choices of materials and material combinations not possible in conventional bulk layer techniques. This is utilized in the nanostructured LED according to the embodiments of the invention to provide LEDs producing light in wavelength regions not accessible by some conventional techniques, for example violet and UV wavelength regions.

The design according to the embodiments of the invention allows for inclusions of heterostructures as well as areas of different doping within the nanowire, facilitating optimization of electrical and/or optical properties. Further embodiments of the invention are defined in the dependent claims. Other objects, advantages and novel features of the invention will become apparent from the following detailed description of the invention when considered in conjunction with the accompanying drawings and claims.

BRIEF DESCRIPTION OF THE DRAWINGS

Preferred embodiments of the invention will now be described with reference to the accompanying drawings, wherein.

DETAILED DESCRIPTION

Figure 1:
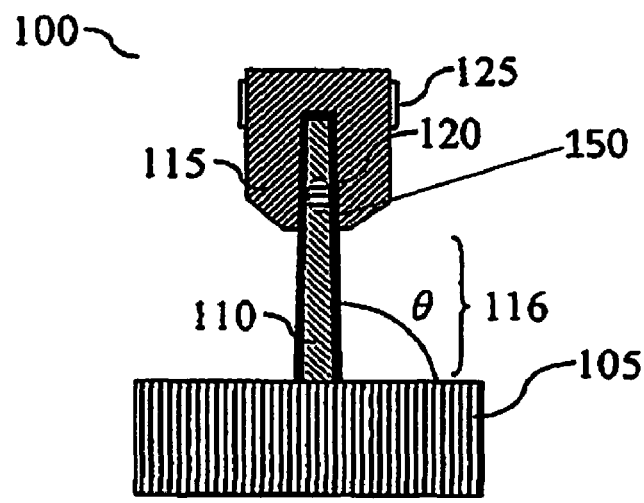
FIG. 1 illustrates schematically an upstanding nanostructured LED according to the embodiments of the invention.

A nanostructured light emitting diode according to the embodiments of the invention comprises an upstanding nanowire as an active element. Suitable methods for growing nanowires on semiconductor substrates are described in US Published Application 2003/010244. Methods of providing epitaxially grown nanowires with heterostructures are to be found in US Published Application 2004/0075464.

For the purpose of this application an upstanding nanowire should be interpreted as a nanowire protruding from the substrate in some angle, the upstanding nanowire for example grown epitaxially from the substrate. The angle with the substrate will typically be a result of the materials in the substrate and the nanowire, the surface of the substrate and growth conditions. By controlling these parameters it is possible to produce nanowires pointing in only one direction, for example vertical, or in a limited set of directions. For example nanowires and substrates of zinc blende and diamond semiconductors composed of elements from columns II, III, V and IV of the periodic table (including II-VI and III-V semiconductors), such nanowires can be grown in the [111] directions and then be grown in the normal direction to any {111} substrate surface. Other directions given as the angle between normal to the surface and the axial direction of the nanowire include 70.53° {111}, 54.73° {100}, and 35.27° and 90°, both to {110}. Thus the nanowires define one, or a limited set, of directions.

According to the embodiments of the invention the nanowire of the nanostructured LED is used as a waveguide directing at least a portion of the light produced by the nanostructured LED in a direction given by the upstanding nanowire. The preferred waveguiding nanowire LED structure includes a high refractive index core with one or more surrounding cladding with refractive indexes less than that of the core. The structure is either circular symmetrical or close to being circular symmetrical. Light generation waveguiding in circular symmetrical structures are well known for fiber-optic applications and many parallels can be made to the area of rare-earth-doped fiber amplifiers and lasers. However, one difference is that fiber amplifiers are optically pumped while the described nanowire LED structure can be seen as electrically pumped. One well know figure of merit is the so called Numerical Aperture, NA: $NA=\sqrt{n_1^2-n_2^2}$, wherein $n_1$ and $n_2$ are the refractive indexes of the core and cladding, respectively. The NA determined the angle of light captured by the waveguide. For light generated inside the core of the waveguide the angle of capture, $\phi$, can be determined as $n_1 \cdot \cos(\phi)=n_2$. The NA and angle of captured light is an important parameter in the optimization of a new LED structure.

Typical values for III-V semiconductor core material is refractive indexes in the range from 2.5 to 3.5. When combined with glass type of cladding material such as $SiO_2$ or $Si_3N_4$ having refractive indexes ranging from 1.4 to 2.0, the angle of capture can be as high as 65 degrees. An angle of capture of 65 degrees yield that up to 75% of the light generated can be captured and guided by the structure (both directions).

One consideration in the optimization of light extraction is to made the NA vary along the nanowire structure to optimize light extraction from the structure. In general, it is ideal to have the NA be highest when the light generation takes place furthest away from the exit location. This will maximize the light captured and guided toward the exit. In contrast, closer to the exit end of the structure, the NA can be made smaller since light generated will radiate in random directions and most of the radiate light will hit the top and side of the top part of the structure and exit. Having a lower NA in the top part of the structure also minimizes the light captures and guide back down through the structure which may not be ideal unless a reflector is inserted in the bottom of the structure. A low NA can be obtained by surrounding the III-V nanowire core with another III-V cladding of different composition with slightly lower refractive index.

A nanostructured LED 100 according to the embodiments of the invention is schematically illustrated in FIG. 1 and comprises a substrate 105 and a nanowire 110 epitaxially grown from the substrate in a defined angle θ. A portion of the nanowire is enclosed by a volume element 115. The volume element 115 is preferably epitaxially connected to the nanowire 110. In other words, the volume element 115 is a relatively thick shell that is epitaxially grown only around the upper portion of the nanowire 110, but not around the lower portion (such as the waveguiding portion 116) of the nanowire 110. A portion the waveguide 116, or portions, of the nanowire 110 are arranged to act as a waveguide directing at least a portion of the produced light in a general direction given by the elongated direction of the nanowire. This functionality of the nanowire is illustrated with arrows in the figure. A pn junction 150 is formed by combination of the nanowire 110 and the volume element 115. Preferably, the nanowire 110 has one conductivity type and the volume element 115 has the opposite conductivity type. For example, the nanowire 110 may be intrinsically p-type as grown or it may be intentionally doped p-type. In that case, the volume element 115 is doped n-type. Of course for an n-type nanowire, the volume element may be doped p-type.

The volume element provides a high degree of doping, and hence the pn-junction can be formed without a direct doping of the nanowire 110, or at least without varying the direct doping of the nanowire 110. This is advantageous since doping of the 1D structure can be technologically challenging and costly to implement in large scale production. The function of the volume element 115 and the interplay between the nanowire 110 and the volume element 115 will be further discussed below. A contact 125 is provided on the volume element 115, for example on top, or in a wrapping configuration on the circumferential outer surface (depicted). The substrate 105 and part of the upstanding structure may be covered by a cover layer 107. The cover layer 107 may comprise a thin film, such as an insulating film, for example silicon oxide, silicon nitride, BPSG, etc., as illustrated in FIG. 1. Alternatively, the cover layer 107 may comprise an insulating filler material filling the space surrounding the nanostructured LED.

The nanowire 110 typically has a diameter in the order of 100 nm to 500 nm, and the volume element a diameter in the order of 500 nm to 1000 nm, i.e. a thickness preferably on the order of 150 nm greater, such as about 200 nm, for the part of the volume element 115 enclosing the nanowire. The length of the waveguide portion 116 of the nanowire is typically and preferably in the order of 1 to 10 µm. The length of the volume element is typically and preferably in the order of 1 to 5 µm. The dimensions of the volume element should be such that the properties as regards to, for example, receptivity to doping are those generally associated and expected from a bulk material. In other words, the volume element 115 is sufficiently thick and long such that it has bulk semiconductor like doping characteristics rather than 1D nanowire-like doping characteristics. A volume element of, for example, InGaP:Si with a thicknesses above 150 nm has been shown to show acceptable receptivity to doping. The dimensions, both in actual numbers and that of the parts relative to each other can be varied in order to optimize certain criteria and to accommodate for different combinations of materials.

Figure 2:
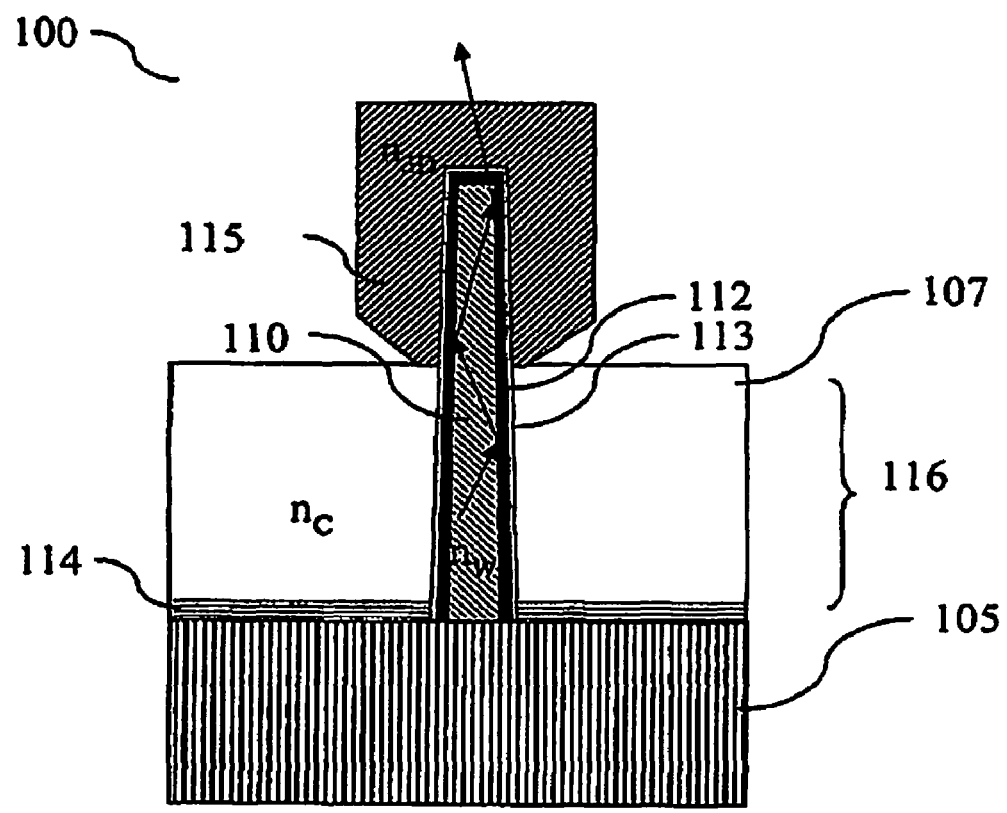
FIG. 2 illustrates schematically the waveguiding properties of the nanowire of the nanostructured LED according to the embodiments of the invention.

The pn-junction results in an active region 120 arranged in the nanowire, or in the vicinity thereof, wherein the light is produced. It should be noted that the position of active region 120 in FIG. 1 is a non-limiting example. Illustrated in FIG. 2 are the waveguide properties of the waveguide portion 116. The materials of the different members of the nanostructured LED are chosen so that the nanowire will have good waveguiding properties vis-à-vis the surrounding materials, i.e. the refractive index of the material in the nanowire 110 should be larger than the refractive indices of the surrounding materials. If the nanowire 110 has a first refractive index, $n_W$, the material surrounding the nanowire in waveguide portion 116, typically the cover layer 107, has a second refractive index, $n_C$, and the a volume element a third refractive index, $n_{VE}$, where $n_W > n_C$ and $n_W > n_{VE}$. Typical values for the nanostructured LED are $n_W \approx 3$, $n_C \approx 1.5$ and $n_{VE} = 3$.

The nanowire 110 may be provided with one or more cladding layers. A first cladding layer 112, may be introduced to improve the surface properties of the nanowire. For example, if a GaAs nanowire is utilized, it has been shown that the properties are improved by adding a cladding layer 112 of GaInP. Further cladding layers, for example an optical cladding layer 113 may be introduced specifically to improve the waveguiding properties of the nanowire 110, in a manner similar to what is well established in the area of fiber optics. The optical cladding layer 113 typically has a refractive index in between the refractive index of the nanowire and the surrounding material. Alternatively, the cladding layer 113 has a graded refractive index, which has been shown to improve light transmission in certain cases. If an optical cladding layer 113 is utilized, then the refractive index of the nanowire, $n_W$, should define an effective refractive index for both the nanowire and the cladding layers. If desired, another layer 114, such as an insulating passivation layer or a reflective layer, may be formed over the substrate 105.

The ability to grow nanowires with well defined diameters, as described in the above cited references and exemplified below, is in one embodiment of the invention utilized to optimise the waveguiding properties of the nanowire 110, or at least the waveguiding portion 116, with regards to the wavelength of the light produced by the nanostructured LED 100. As is well known, the re-combination process that is the basis for the light production of a LED, produces light in a narrow wavelength region, dependent on the material properties. In the embodiment, the diameter of the nanowire 110 is chosen so as to have a favourable correspondence to the wavelength of the produced light. Preferably the dimensions of the nanowire 110 are such that an uniform optical cavity, optimised for the specific wavelength of the produced light, is provided along the nanowire. The core nanowire must be sufficiently wide to capture the light. A rule of thumb would be that diameter must be larger than $\lambda/2n_W$, wherein $\lambda$ is the wavelength of the produced light and $n_W$ is the refractive index of the nanowire 110.

For a nanostructured LED arranged to produce light in the visible region, the diameter of the waveguiding portion of the nanowire should preferably be larger than 80 nm in order for the nanowire to be an effective waveguide. In the infra-red and near infra-red a diameter above 110 nm would be sufficient. An approximate preferred upper limit for the diameter of the nanowire is given by the growth constrains, and is in the order of 500 nm. The length of the nanowire 110 is typically and preferably in the order of 1-10 µm, providing enough volume for the active region 120, and at the same time not unnecessarily long to cause internal absorption.

Figure 3A:
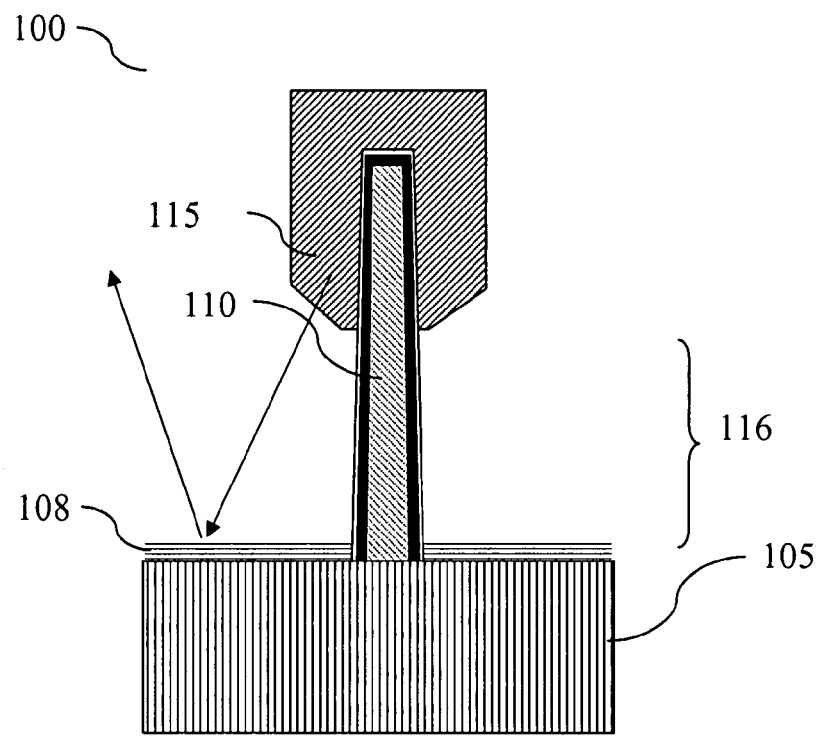
FIG. 3a-b illustrate schematically the use of a reflective layer in combination with a nanostructured LED according to the embodiments of the invention.
Figure 3B:
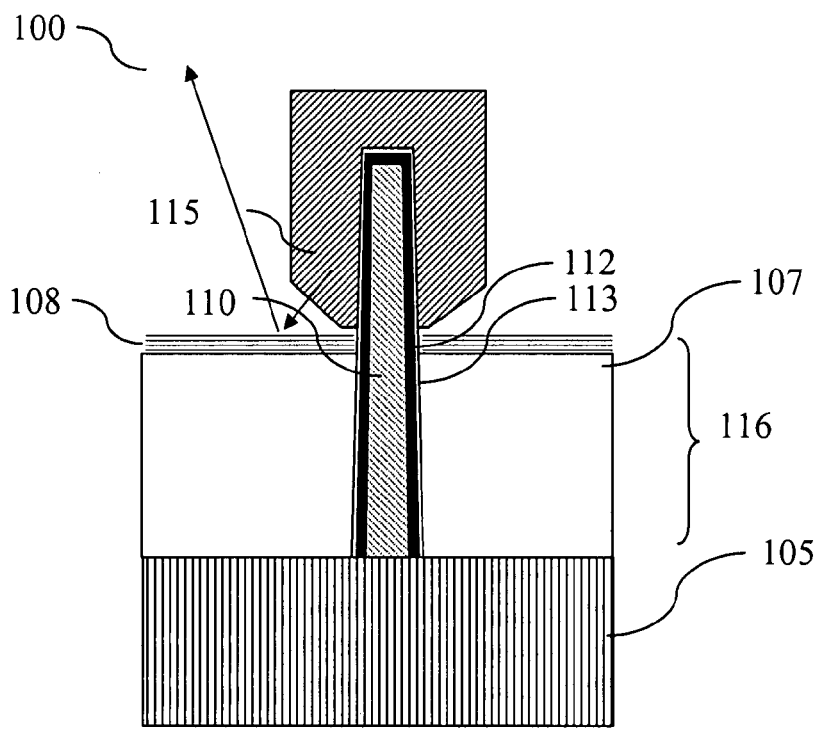

In one embodiment illustrated in FIG. 3a-b, an optional reflective layer 108 is provided on the substrate 105 (FIG. 3a), or alternatively on the cover layer 107 (FIG. 3b). The purpose of the reflective layer is to reflect light that is emitted from the nanostructured LED in downward directions. The reflective layer 108 is preferably provided in the form of a multilayered structure comprising repeated layers of AlGaAS/GaAs or GaN/AlGaN for example, or as a metal film.

Figure 4:
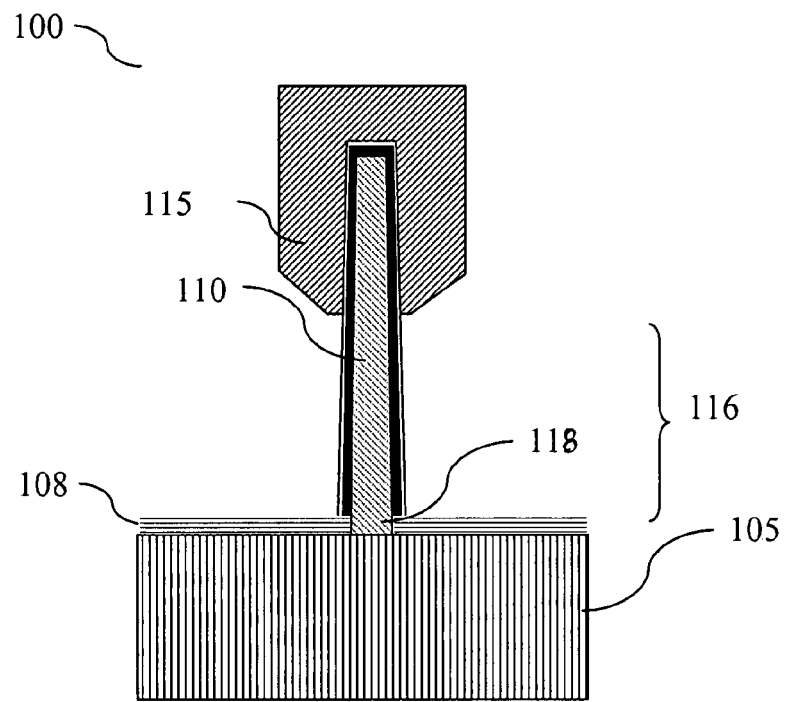
FIG. 4 illustrates schematically an embodiment of a nanostructured LED according to the embodiments of the invention.

According to one embodiment of the invention illustrated in FIG. 4, the reflective layer 108 is arranged to continue under a portion of the nanowire 110, or the nanowire/cladding combination. Hence, a stem 118 adjacent to the substrate is formed, the stem 118 having a smaller diameter than the nanowire/cladding above. A method of producing such will be described below. If the diameter of stem 118 is sufficiently smaller than the wavelength of the light, then a large fraction of the directed light mode will extend outside the waveguide, enabling efficient reflection by the reflective layer 108 surrounding the narrow part of the waveguide. The reflective layer 108 can be perpendicular to the nanostructured LED or alternatively is designed so that a large amount of the light hitting the reflective layer 108 will be reflected in the upward direction. By fabricating the layer 108 and the waveguide in a configuration with an angle other than 90° between them, the light can be directed at a different direction than the waveguide. A special case of such is when the nanowires are grown in an angle with respect to the substrate different from 90°. If the nanowire, or nanowire-cladding assembly, has a first effective refracting index, $n_W$, and the reflective layer has a second effective refracting index, $n_S$, and $n_W > n_C$, then the angle between nanowire and reflective layer can be chosen to achieve total internal reflection.

Figure 5:
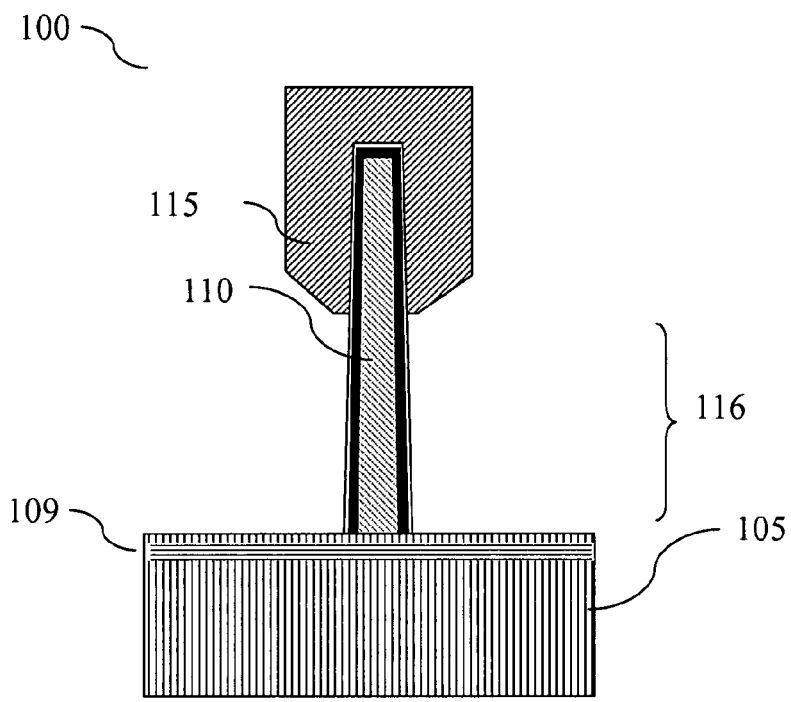
FIG. 5 illustrates schematically an embodiment of a nanostructured LED according to the embodiments of the invention.
Figure 6:
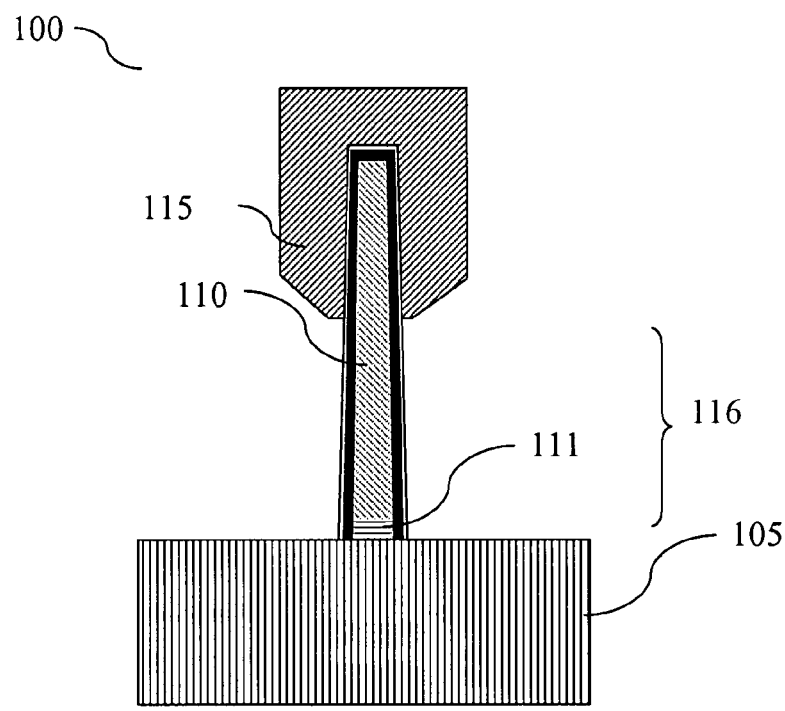
FIG. 6 illustrates schematically an embodiment of a nanostructured LED according to the embodiments of the invention.

An alternative approach to get a reflection in the lower end of the nanowire is to arrange a reflective layer 109 in the substrate underneath the nanowire, as illustrated in FIG. 5. The reflective layer may for example be a multilayer structure as described above which in the art is known to produce highly reflective surfaces. Yet another alternative is to introduce reflective portion 111 within the nanowire, as illustrated in FIG. 6. Such reflective portion can be a multilayered structure provided during the growth process of the nanowire, the multilayered structure comprising repeated layers of for example $SiN_x/SiO_x$ (dielectric) or GaAs/AlGaAs (semiconductor).

Figure 7:
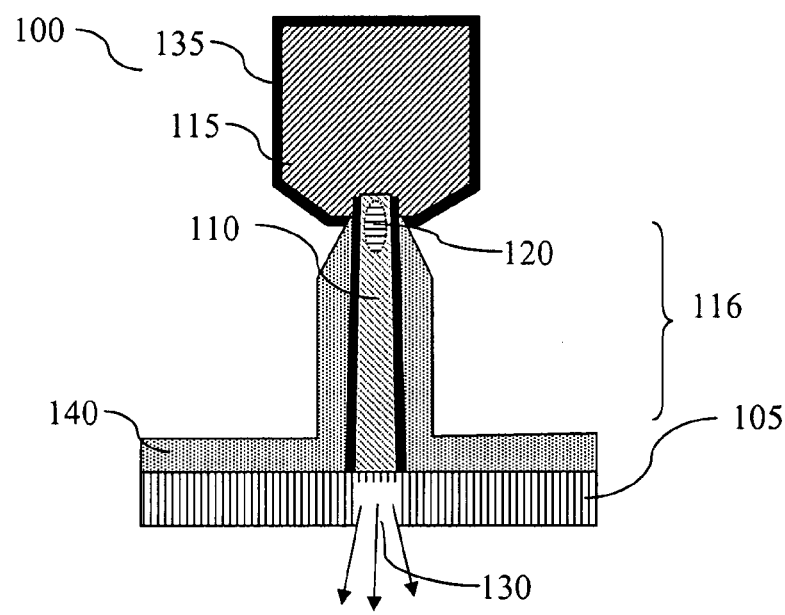
FIG. 7 illustrates schematically an embodiment of a nanostructured LED according to the embodiments of the invention.

In a further embodiment, illustrated in FIG. 7, a major part of the produced light is directed by the waveguiding portion 116 of the nanowire 110 in a downward direction through the substrate 105. The light can be directed through the entire thickness of the substrate if the substrate is transparent to light, or alternatively, the substrate is provided with a cut out 130 beneath the base of the nanowire 110 in order to reduce the thickness of the substrate and thereby reduce the scattering or absorption of light in the substrate. The substrate is preferably made of transparent material. Alternatively the nanostructured LED can be removed from the substrate. In this case the nanowire can at its lower end by contacted by a wrap contact. A portion, or preferably all of the outer surface of the volume element 115 may be covered by a reflective layer 135 which increases the radiation of the produced light through the waveguiding portion 116. The reflective layer, for example formed of a metal, may additionally serve as a contact. Part of the nanowire 110 and the substrate is optionally covered by a protective layer of $SiO_2$ 140.

Figure 8:
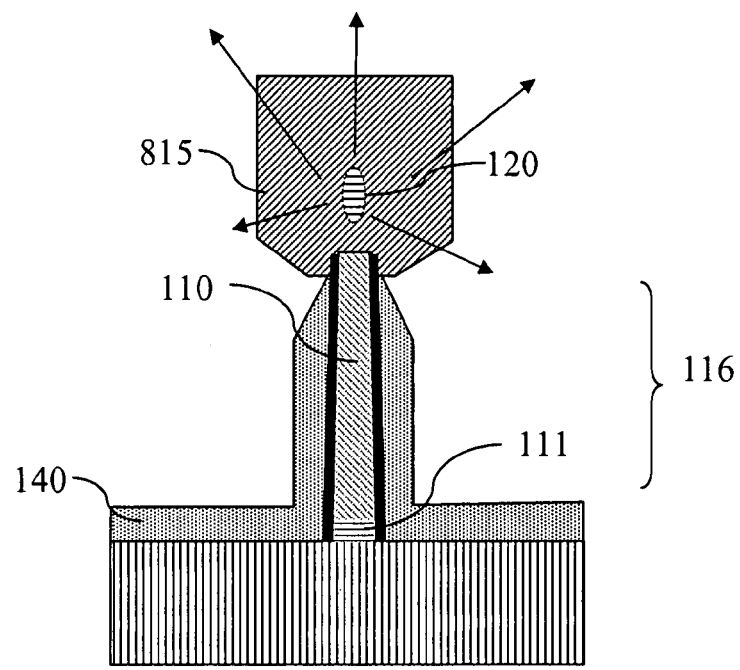
FIG. 8 illustrates schematically an embodiment of a nanostructured LED according to the embodiments of the invention.

In an embodiment illustrated in FIG. 8 the volume element 815 is arranged to be a dispersive element, giving a light radiation that is essentially evenly distributed over a wide angle. Such device is well suited for illuminating purposes wherein an even illumination is required. The active region 120 may be arranged in the nanowire or within the volume element 815, and above the upper end of the nanowire 110 as depicted. The nanowire 110 should preferably at is lower end be provided with some of the reflective means described above, for example reflective means 111 within the nanowire, in order to redirect light upwards. The geometry of the volume element can be designed to further disperse the light. Dispersion is provided at the junction between the nanowire 110 waveguide and the volume and further at the edge formed by the upper boundary of the volume element 115. The height and width of the volume element are chosen so that the edge distributes the angle of the dispersed light further.

Figure 9:
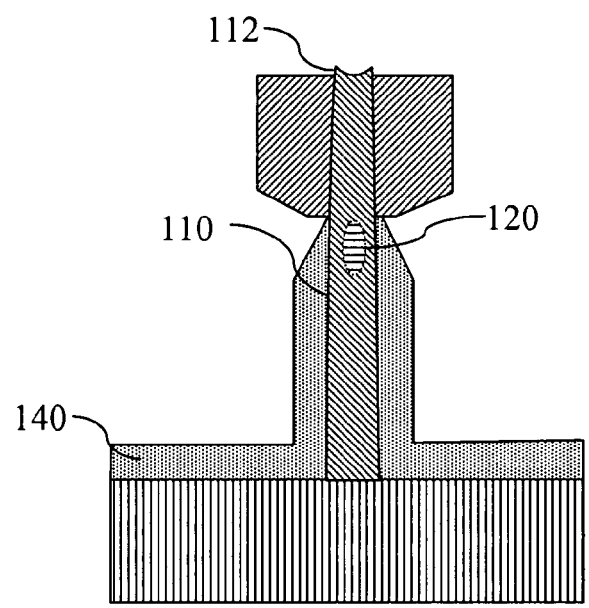
FIG. 9 illustrates schematically an embodiment of a nanostructured LED according to the embodiments of the invention.

The waveguiding properties of the nanowire LED also provide for a collected and directional oriented beam which can be shaped and directionally steered to provide for a desired radiation pattern. This can be done by a combination of shaping the exit interface in a lens-like fashion and by using the variable NA method previously described. In general, if a broader radiation pattern is desired, the NA close to the exit should be altered to smaller values either gradually or abruptly at some distance from the exit surface. If it is desirable to have a narrow radiation pattern, this can be accomplish either by having a focussing concave lens like exit surface or/and maintaining as high an NA as possible in the top part of the nanowire LED close to the exit. The diameter of the core nanowire also plays an important role in shaping radiation pattern. In general the smaller the diameter the wider the radiation pattern, while a large diameter core nanowire would call for a more confined and directional radiation pattern. This perhaps counter intuitive effect is well known in optical engineering as the far-field radiation pattern is in fact a Fourier transform of the near-field. As is well known, the Fourier transform of a short or narrow event yields a long or wide event in the Fourier domain. One extreme example is the delta function, which has Fourier transform that is infinitely wide and constant in density. The parallel to optical radiation is that a point light source (delta-function in near field) radiates with constant density in all directions ("infinitely" wide radiation in the far-field). One embodiment of the invention, schematically illustrated in FIG. 9, is optimized for providing a collected and directional oriented beam. The nanowire 110 of relatively large diameter, preferably above 150 nm, extends to the upper surface of the volume element 115. The nanowire 110 is provided with a concave lens like exit surface 112 on the upper end.

The previous depicted cylindrical volume element 115, which is achievable with the referred methods of growing nanowires, should be seen as an exemplary shape. Other geometries that are plausible include, but are not limited to a cylindrical bulb with a dome-shaped top, a spherical/ellipsoidal, and pyramidal shapes.

Figure 10:
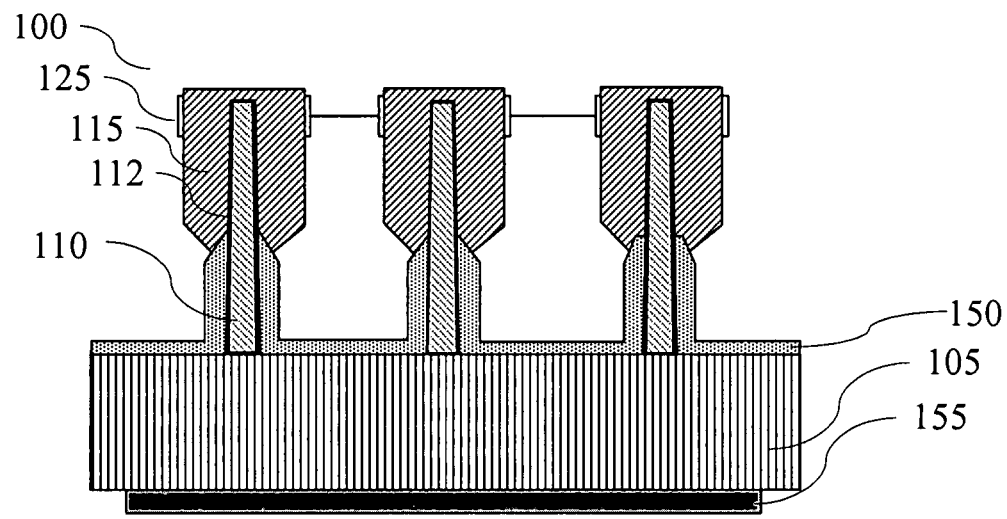
FIG. 10 illustrates schematically an assembly of a plurality of a nanostructured LEDs according to the embodiments of the invention.

In typical implementations, a large plurality of nanostructured LEDs are provided in one device. A portion of such device is illustrated in FIG. 10. A plurality of nanostructured LEDs 100 are epitaxially grown on a Zn-doped GaP substrate 105. The nanowires 110 of the LEDs are of intrinsic GaAs, and provided with a concentric layer of undoped InGaP. The volume elements 115 comprises of Si-doped InGaP. The lower parts of the nanowires and the substrate are covered by a $SiO_2$-layer 150. A back plane contact 155 is provided on the substrate connecting a plurality of LEDs, and each individual LED is provided with a wrap around contact 125 on the volume elements 115. The wrap around contacts 125 are connected in series for a group-wise addressing of the LEDs.

Figure 11:
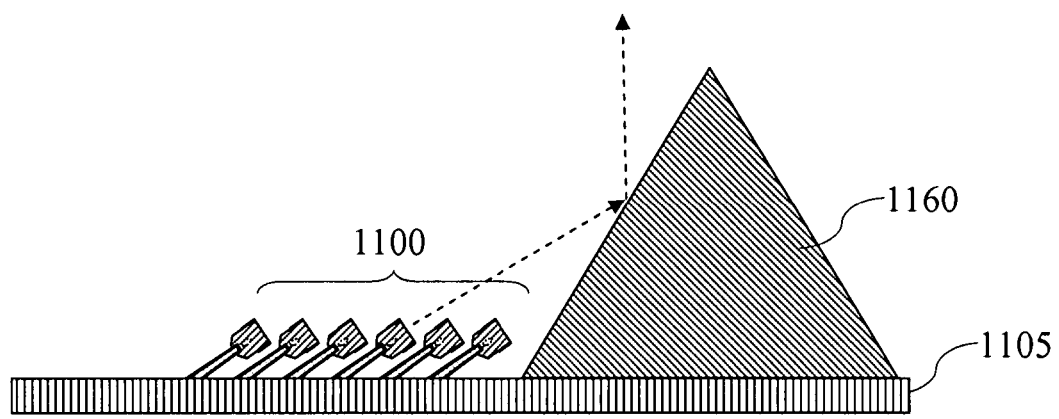
FIG. 11 illustrates schematically an assembly of a plurality of a nanostructured LEDs in combination with a reflective plane.

In one embodiment the inherent property that nanowires grown in a limited set of preferred directions, as discussed above, is utilized. A plurality of nanostructured LEDs 1100 are provided on a substrate 1105, as illustrated in FIG. 11. All LEDs having the same direction, or one of a limited set of directions. Preferably the LEDs are arranged to produce fairly directed light beams. Adjacent to the group of LEDs, a reflective means (i.e., a reflector) 1160 is provided, with an angle to the substrate corresponding to the direction of the LEDs so that the light emitted from the LEDs is reflected by the reflective means 1160 in an desired direction. The path of light is schematically indicated with dashed arrows. If the LEDs have a plurality of directions, for example corresponding to the four [111] directions, a corresponding plurality of reflecting means can be provided, preferably directing all light into the same direction, for example perpendicular to the substrate. The reflector 1160 may comprise any structure having a reflective surface which is inclined with respect to the substrate at an angle different than 90 degrees. For example, the reflector 1160 may comprise a metal structure, such as a triangular or pyramidal structure having an inclined side facing the nanowires.

Figure 12:
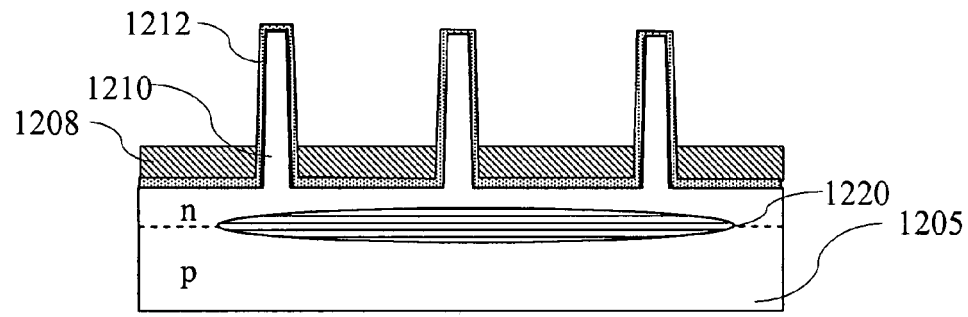
FIG. 12 illustrates schematically an embodiment of a nanostructured LED comprising nanowires on a planar light emitting structure according to the embodiments of the invention.

Nanowires acting as waveguides can be utilized to improve the performance of conventional planar LEDs. In the embodiment depicted in FIG. 12 a plurality of nanowires 1210 are arranged on the surface of a planar LED. Light is produced in the active layer 1220 of the planar LED, for example in a layer of GaAsP. The nanowires 1210 are epitaxially connected on top of the planar LED layers in order to get a good matching of the different parts. The nanowires 1210 may be coated by a cladding layer 1212 protecting the nanowires and/or improving the properties, for example an insulating layer, such as $Si_3N_4$. The surface in between the nanowires 1210 are preferably coated with a reflective layer 1208, for example of Au. At least a part of the light produced in the active region 1220 will enter the nanowires 1210 acting as waveguides, leading the light away from the substrate plane. By the same mechanism as described above the nanowires can be arranged to focus the light in a well defined direction or directions.

To form the pn-junction for light production at least part of the nanostructure is doped. As indicated above, the volume element is provided partly to solve general difficulties associated with doping of nanoelements, and to facilitate good electrical contacting properties. It is important to decrease access resistances in order to increase device efficiency. The nanowire in itself is not optimal from this perspective as the elongated nature and low area of the nanowire cross-section will build device resistance. The main tools of fabricating low resistance contacts, a task complicated by the intrinsically low contact-surfaces given by the nanowire geometry, are high doping and low band gap adjustment on the semiconductor side of the contact, but as mentioned, the doping of nanoelements is challenged by several factors. However, certain other parts of a nanowire device are not in need of high doping, or, their doping-level is of less priority and can be balanced against other design parameters. There are also devices where doping of critical parts will decrease device performance. Such examples of contra-productive doping effects are non-emitting impurity levels in an optical region or impurity scattering, decreasing mobility, in a field effect channel.

The volume element 115 according to the embodiments of the invention extends in three dimensions, has a large volume and a large surface, whereby the challenging doping procedures for nanoelements may be avoided, the processing is simplified and more reliable, the access resistance may be decreased, both due to doping and to an increased contact surface, the advantages of using a nanowire as an active component in an LED may fully utilized.

The volume element/nanowire architecture enhances both electrical and optical performance of a LED. The volume element 115 works as a carrier reservoir enabling high carrier injection into the nanowire from a region with well defined doping where low resistance contacts easily can be fabricated, preferably in a wrap around configuration in order to increase contact area and minimize distance between the nanowire and the contact. The low internal resistance and the increased amount of carriers provide a high injection of majority carriers into the nanowire already at low forward voltages. High injection of carriers into the nanowire 110 introduces high concentrations of electron hole pairs into the nanowire increasing light emitting recombination. The high concentration of electron-hole pairs, in combination with the active region being extended into a waveguide, directing the light, can enable stimulated emission, increasing the output of the device further.

By using different material compositions in the nanowire 110 and the volume element 115, the nanowire material composition can be chosen to propagate into the volume element 115 in order to decrease the optical disturbance by the connection with the nanowire. Extending the length of the nanowire in the direction of the emitted light will increase re-absorption. To decrease re-absorption the composition of the nanowire is adjusted in the direction of the emitted light in order to raise the band gap as compared to the energy of the emitted light. Thus, the nanowire composition varies along the vertical direction, such that the band gap of the nanowire increases in a direction away from the substrate. The band gap grading can be provided by varying a composition of a ternary semiconductor of the nanowire from a lower to a higher band gap composition during nanowire growth.

Figure 13:
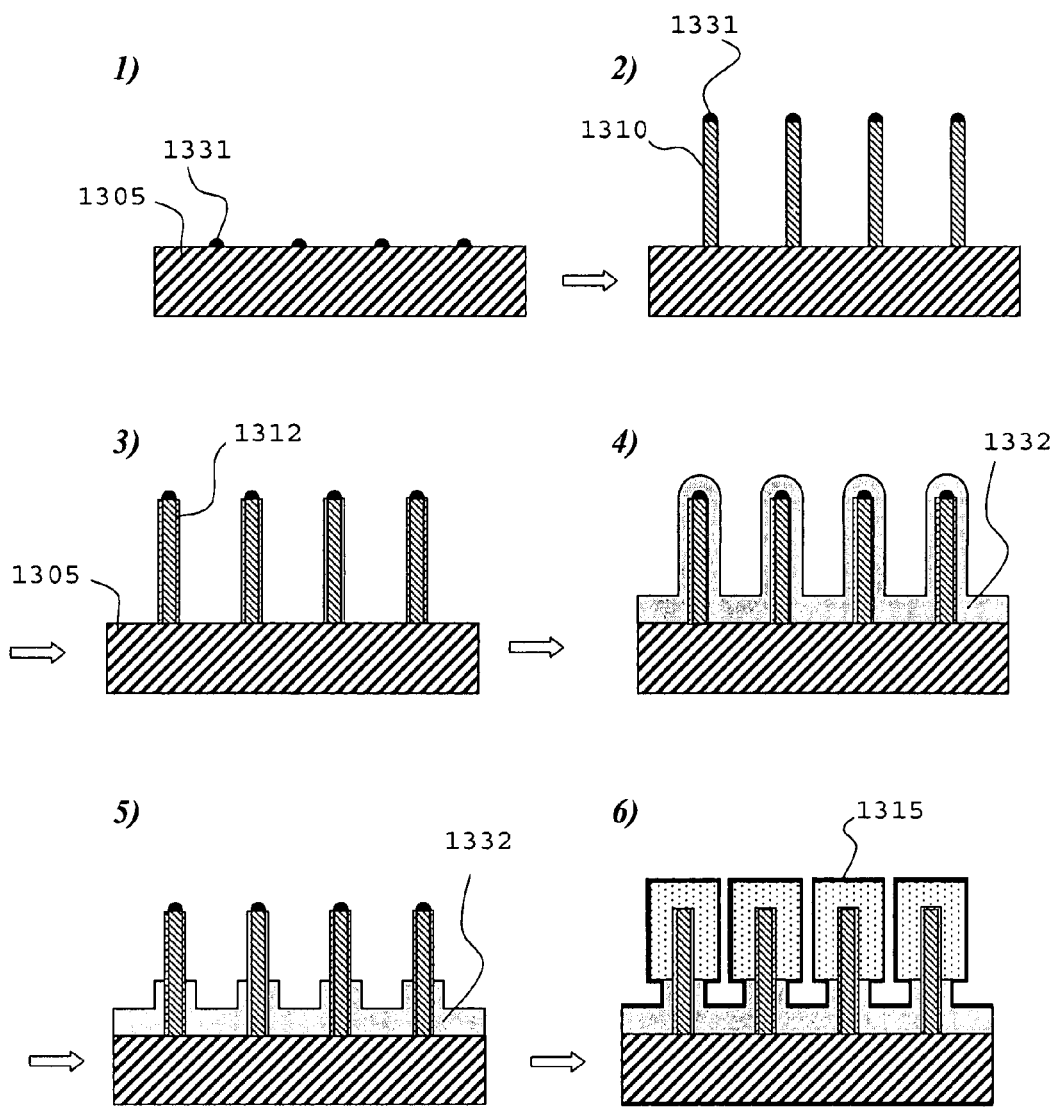
FIG. 13 illustrates the basic production steps in the method according to the embodiments of the invention.

A method of fabricating nanostructured LED is to first grow a nanowire, according to the above referred processes. Part of the nanowire is then masked and the volume element is re-grown selectively. The method is illustrated in FIG. 13. The volume element grows both axially and radially. Hence, when the nanowire is masked partly, the nanowire becomes enclosed in the volume element. Appropriate masking materials are e.g. silicon nitride, silicon oxide etc.

Considering systems where nanowire growth is locally enhanced by a substance, as VLS grown nanowires, the ability to alter between radial and axial growth by altering growth conditions enables the procedure (nanowire growth, mask formation, and subsequent selective growth) which can be repeated to form nanowire/3D-sequences of higher order. For systems where nanowire growth and selective growth are not distinguished by separate growth conditions it may be better to first grow the nanowire along the length and by different selective growth steps grow different types of 3D regions or volume elements.

A fabrication method according to the present invention in order to fabricate a light emitting pn-diode/array with active nanowire region(s) formed of GaAs and InGaP, illustrated in FIG. 13 comprises the steps of:

1. Defining of local catalyst/catalysts on a p+ GaP substrate 1305 by lithography.
2. Growing GaAs nanowire 1310 from local catalyst islands 1331. The growth parameters adjusted for catalytic wire growth.
3. Radial growing of thin InGaP concentric layer 1312 around the nanowire (cladding layer).
4. Depositing of $SiO_2$ as mask material 1332.
5. Partially etching back of mask 1332 to expose the upper parts of the nanowires.
6. Selective epitaxial growing of n+ InGaP volume element 1315 on exposed upper part of the nanowire. The growth parameters are adjusted to give radial growth.
7. Forming contacts 1325 on the volume element and to the substrate (as shown in FIG. 10).

The growth process can be varied in known ways to for example include heterostructures in the nanowires, provide reflective layers etc. The stem 118 utilized in some embodiments can be provided by first growing a thin nanowire (step 2), depositing a reflective layer or a selective growth mask 1332 covering the lower part of the nanowire, and radial growing of cladding layer 1312 or the nanowire to increase the nanowire thickness.

Depending on the intended use of the nanostructured LED, availability of suitable production processes, costs for materials etc, a wide range of materials can be used for the different parts of the structure. In addition the nanowire based technology allows for defect free combinations of materials that otherwise would be impossible to combine. The III-V semiconductors are of particular interest due to their properties facilitating high speed and low power electronics. Suitable materials for the substrate include, but are not limited to: Si, GaAs, GaP, GaP:Zn, GaAs, InAs, InP, GaN, $Al_2O_3$, SiC, Ge, GaSb, ZnO, InSb, SOI (silicon-on-insulator), CdS, ZnSe, CdTe. Suitable materials for the nanowire 110 and the volume element 115 include, but are not limited to: GaAs (p), InAs, Ge, ZnO, InN, GaInN, GaN AlGaInN, BN, InP, InAsP, GaInP, InGaP:Si, InGaP:Zn, GaInAs, AlInP, GaAlInP, GaAlInAsP, GaInSb, InSb, Si. Possible donor dopants for e.g. GaP are Si, Sn, Te, Se, S, etc, and acceptor dopants for the same material are Zn, Fe, Mg, Be, Cd, etc. It should be noted that the nanowire technology makes it possible to use Group IIInitrides, such as GaN, InN and AlN, which gives facilitates fabrication of LEDs emitting light in wavelength regions not easily accessible by conventional technique. Other combinations of particular commercial interest include, but are not limited to GaAs, GaInP, GaAlInP, GaP systems. Typical doping levels range from $10^{18}$ to $10^{20}$. A person skilled in the art is familiar with these and other materials and realizes that other materials and material combinations are possible.

The appropriateness of low resistivity contact materials are dependent on the material to be deposited on, but metal, metal alloys as well as non-metal compounds like Al, Al—Si, $TiSi_2$, TiN, W, $MoSi_2$, PtSi, $CoSi_2$, $WSi_2$, In, AuGa, AuSb, AuGe, PdGe, Ti/Pt/Au, Ti/Al/Ti/Au, Pd/Au, ITO (InSnO), etc. and combinations of e.g. metal and ITO can be used.

The foregoing description of the invention has been presented for purposes of illustration and description. It is not intended to be exhaustive or to limit the invention to the precise form disclosed, and modifications and variations are possible in light of the above teachings or may be acquired from practice of the invention. The description was chosen in order to explain the principles of the invention and its practical application. It is intended that the scope of the invention be defined by the claims appended hereto, and their equivalents. All patents, published applications and other references mentioned herein are incorporated by reference in their entirety.

The invention claimed is:

1. A nanostructured LED comprising a substrate and at least one upstanding nanowire protruding from the substrate, a pn-junction contributing to a formation of an active region to produce light, wherein at least a first part of the nanowire is a waveguide forming a wave-guiding section directing at least a portion of the light produced in the active region in a direction given by the nanowire, wherein a diameter of the nanowire is larger than $\lambda/2n_W$, wherein $\lambda$ is a wavelength of the produced light and $n_W$ is the refractive index of the nanowire and wherein at least a second semiconductor material part of the nanowire is not a waveguide.

2. The nanostructured LED according to claim 1, further comprising a volume element epitaxially connected to the nanowire.

3. The nanostructured LED according to claim 1, wherein the nanowire has a first effective refractive index, $n_W$, and a material surrounding at least a portion of the nanowire has a second effective refractive index, $n_C$, and the first effective refractive index is larger than the second effective refractive index, $n_W > n_C$, providing wave-guiding properties to the nanowire.

4. The nanostructured LED according to claim 3, wherein the nanowire forms a defined angle with the substrate and the angle between nanowire and substrate is sufficient to achieve total internal reflection, given the first and the second effective refractive indexes.

5. The nanostructured LED according to claim 3, wherein the nanowire is provided with at least one cladding layer forming a nanowire-cladding assembly.

6. The nanostructured LED according to claim 5, wherein the cladding layer is an optical cladding layer enhancing wave-guiding properties of the nanowire.

7. The nanostructured LED according to claim 5, wherein one or a plurality of cladding layers provide a graded refractive index towards a boundary of the nanowire-cladding assembly enhancing the wave-guiding properties of the nanowire.

8. The nanostructured LED according to claim 7, wherein the LED is designed to produce light in a certain wavelength region, and a diameter of the nanowire is such that the light propagation in the nanowire is not impeded by size effects for light in the certain wavelength region.

9. The nanostructured LED according to claim 8, wherein the nanostructured LED is arranged to produce light in a visible region and the diameter of the wave-guiding section of the nanowire is larger than 80 nm.

10. The nanostructured LED according to claim 8, wherein the nanostructured LED is arranged to produce light in infrared or near infra-red region and the diameter of the wave-guiding section of the nanowire is larger than 110 nm.

11. The nanostructured LED according to claim 8, wherein the diameter of the nanowire is less than 500 nm.

12. The nanostructured LED according to claim 2, wherein the active region is arranged within the nanowire.

13. The nanostructured LED according to claim 12, wherein the volume element provides carriers for light emitting recombination in the active region.

14. The nanostructured LED according to claim 1, wherein the nanowire forms an optical cavity that matches an optical mode of the wavelength of the produced light.

15. The nanostructured LED according to claim 7, wherein the nanowire-cladding assembly forms an optical cavity that matches an optical mode of the wavelength of the produced light.

16. The nanostructured LED according to claim 2, wherein the substrate is provided with a reflecting layer, the reflecting layer being provided with a through hole, through which the nanowire extends.

17. The nanostructured LED according to claim 2, wherein a reflecting portion is provided within the nanowire and arranged to reflect light traversing in the direction towards the substrate.

18. The nanostructured LED according to claim 17, wherein the reflecting portion is a multilayered structure.

19. The nanostructured LED according to claim 17, wherein reflecting portion is provided by a reflective layer extending under a part of the nanowire and covering an outer portion of a cross section of the nanowire.

20. The nanostructured LED according to claim 19, wherein the nanowire has a first effective refracting index, $n_W$; the reflective layer has a second effective refracting index, $n_S$, and $n_W > n_C$; and an angle between the nanowire and the reflective layer is sufficient to achieve total internal reflection.

21. The nanostructured LED according to claim 19, wherein a nanowire is surrounded by at least one cladding layer such that a nanowire-cladding layer assembly has a first effective refracting index, $n_W$; the reflective layer has a second effective refracting index, $n_S$, and $n_W > n_C$; and an angle between the nanowire and the reflective layer is sufficient to achieve total internal reflection.

22. The nanostructured LED according to claim 2, wherein the nanowire and the volume element are arranged to direct light in a downward direction through the substrate as seen from the volume element.

23. The nanostructured LED according to claim 3, comprising a planar LED containing LED layers and a plurality of nanowires arranged in an upstanding configuration on the planar LED surface, and in epitaxial connection with an upper LED layer.

24. The nanostructured LED according to claim 3, wherein the volume element is arranged to spread the emitted light by dispersion at a junction between the nanowire and the volume element.

25. The nanostructured LED according to claim 3, wherein the volume element is arranged to spread the emitted light by dispersion at a junction between the nanowire and the volume element and the height and width of the volume element are arranged to further disperse the light.

26. A device comprising a plurality of nanostructured LEDs according to claim 1, wherein a group of nanostructured LEDs is arranged to emit light in one or a limited set of well defined directions, and at least one reflector is arranged to reflect light from one of the directions associated with the group of nanostructured LEDs.

27. The nanostructured LED according to claim 2, wherein:
the volume element comprises a shell having a thickness greater than the diameter of the nanowire;
the volume element is epitaxially grown only around an upper portion of the nanowire but not around the wave-guiding section of the nanowire;
the volume element has bulk semiconductor like doping characteristics;
the volume element is doped with dopants of a first conductivity type;
the nanowire comprises a semiconductor material of a second conductivity type; and
the pn junction is formed between the nanowire and the volume element.

28. A nanostructured LED comprising a substrate and at least one upstanding nanowire protruding from the substrate, a pn-junction contributing to a formation of an active region to produce light, wherein at least a first part of the nanowire is a waveguide forming a wave-guiding section directing at least a portion of the light produced in the active region in a direction given by the nanowire, wherein a diameter of the nanowire is larger than $\lambda/2n_W$, wherein $\lambda$ is a wavelength of the produced light and $n_W$ is the refractive index of the nanowire and wherein at least a second non-catalyst containing part of the nanowire is not a waveguide.

* * * * *